(12) United States Patent
Tanida et al.

(10) Patent No.: US 7,259,454 B2
(45) Date of Patent: Aug. 21, 2007

(54) SEMICONDUCTOR CHIP MANUFACTURING METHOD, SEMICONDUCTOR CHIP, SEMICONDUCTOR DEVICE MANUFACTURING METHOD, AND SEMICONDUCTOR DEVICE

(75) Inventors: Kazumasa Tanida, Miyagi (JP); Yoshihiko Nemoto, Tokyo (JP); Kenji Takahashi, Ibaraki (JP)

(73) Assignees: Rohm Co., Ltd., Kyoto (JP); Renesas Technology Corp., Tokyo (JP); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/197,470

(22) Filed: Aug. 5, 2005

(65) Prior Publication Data
US 2006/0038300 A1 Feb. 23, 2006

(30) Foreign Application Priority Data
Aug. 20, 2004 (JP) ............................. 2004-241207

(51) Int. Cl.
*H01L 23/04* (2006.01)
(52) U.S. Cl. ................ 257/698; 257/777; 257/E21.511
(58) Field of Classification Search ................ 257/621, 257/686, 698, 737, 784, 777; 438/108, 667
See application file for complete search history.

(56) References Cited
U.S. PATENT DOCUMENTS
6,847,275 B2 * 1/2005 Sayanagi et al. ........... 333/247

2002/0127776 A1 9/2002 Nakajo et al.
2005/0029674 A1 2/2005 Kazama et al.

FOREIGN PATENT DOCUMENTS

| JP | 2000-510288 | 8/2000 |
|---|---|---|
| JP | 2002-009223 | 1/2002 |
| JP | 2002-118224 | 4/2002 |
| JP | 2002-270721 | 9/2002 |
| WO | WO98/19337 | 5/1998 |

* cited by examiner

*Primary Examiner*—Quoc Hoang
(74) *Attorney, Agent, or Firm*—Rabin & Berdo, PC

(57) ABSTRACT

The invention provides a semiconductor chip manufacturing method, including a step of forming a front-surface-side concave portion in a semiconductor substrate having a front surface and a rear surface, a functional device being formed on the front surface, the front-surface-side concave portion being formed in the front surface and having a predetermined depth smaller than a thickness of the semiconductor substrate; a dummy plug forming step of supplying nonmetallic material into the front-surface-side concave portion and embedding a dummy plug made of the nonmetallic material; a thinning step of removing a part of the rear surface of the substrate and thinning the semiconductor substrate so that the thickness of the semiconductor substrate becomes smaller than the depth of the front-surface-side concave portion and so that the front-surface-side concave portion is formed into a through-hole; a dummy plug removing step of removing the dummy plug; and a step of supplying metallic material into the through-hole and forming a penetration electrode.

2 Claims, 22 Drawing Sheets

SEMICONDUCTOR CHIP MANUFACTURING METHOD, SEMICONDUCTOR CHIP, SEMICONDUCTOR DEVICE MANUFACTURING METHOD, AND SEMICONDUCTOR DEVICE

BACKGROUND OF THE INVENTION

1. Field of the Invention

This invention relates to a semiconductor chip that has a through-hole penetrating in its thickness direction, a method for manufacturing the semiconductor chip, a semiconductor device that has a semiconductor chip having a through-hole penetrating in its thickness direction, and a method for manufacturing the semiconductor device.

2. Description of Related Art

A multichip module (MCM) is known as a semiconductor device having a plurality of semiconductor chips. In the multichip module, an attempt has been made to reduce the mounting area of a semiconductor device by stacking a plurality of semiconductor chips together on a wiring substrate in the semiconductor device. In some of the thus structured semiconductor devices, a penetration electrode is provided in a through-hole penetrating through semiconductor chips in the thickness direction, and a longitudinal electrical connection is achieved by this penetration electrode.

FIG. 13A to FIG. 13H are diagrammatic sectional views for explaining a conventional method for manufacturing a semiconductor chip having a penetration electrode. This method is disclosed by Japanese translation of International Application (Kohyo) No. 2000-510288.

A hard mask 103 having an opening 103a in which a region beside a functional device 101 is exposed is formed on a surface of a semiconductor wafer (hereinafter, referred to simply as "wafer") W on one surface (hereinafter, referred to as "front surface") of which the functional device 101 is provided.

Thereafter, a front-surface-side concave portion 102 that has a depth smaller than the thickness of the wafer W is formed in the region beside the functional device 101 by carrying out reactive ion etching (RIE) where the hard mask 103 is used as a mask, whereafter a contact hole 103b in which a predetermined part of the functional device 101 is exposed is formed in the hard mask 103.

Thereafter, an insulating film 104 made of silicon oxide is formed on the exposed surface in the opening 103a and the exposed surface in the front-surface-side concave portion 102. FIG. 13A shows this state.

Thereafter, an electroconductive diffusion-preventing film 105 is formed on the whole of the front surface of the wafer W that has undergone the foregoing steps (see FIG. 13B), and a seed layer (not shown) is formed on the diffusion preventing film 105. The inside of the opening 103a, the inside of the contact hole 103b, and the inside of the front-surface-side concave portion 102 are then filled with a metal film 106 made of copper by carrying out electrolytic plating where the seed layer is used a seed. Accordingly, the metal film 106 is electrically connected to the functional device 101 through the contact hole 103b. FIG. 13C shows this state.

Thereafter, a part of the metal film 106 and a part of the diffusion preventing film 105 are removed, except for the inside of the front-surface-side concave portion 102, the opening 103a, and the contact hole 103b and except for a predetermined region having a pattern that makes a connection between the inside of the opening 103a and the inside of the contact hole 103b. FIG. 13D shows this state.

Thereafter, a UBM layer 107 and a bump 108 are formed on the metal film 106 outside the front-surface-side concave portion 102, the opening 103a, and the contact hole 103b. The UBM layer 107 lies between the metal film 106 and the bump 108. FIG. 13E shows this state.

Thereafter, the front surface of the wafer W is stuck onto a supporter (not shown), and the rear surface Wr of the wafer W is mechanically ground, whereby the wafer W is thinned. As a result, the front-surface-side concave portion 102 becomes a through-hole 112, and the metal film 106 is exposed to the rear surface Wr of the wafer W. The metal film 106 in the front-side concave portion 102 and in the opening 103a becomes a penetration electrode 109. The remainder of the metal film 106 integral with the penetration electrode 109 functions as a wiring member 110 through which the penetration electrode 109 and the functional device 101 are electrically connected to each other. FIG. 13F shows this state.

A grinding damage layer, which has grinding marks or damage received when ground, exists on the rear surface Wr of the wafer W. To remove the grinding damage layer, the rear surface Wr of the wafer W is subjected to dry etching by approximately 5 μm. At this time, the penetration electrode 109, the diffusion preventing film 105, and the insulating film 104 are hardly etched, and jut from the rear surface Wr of the wafer W. FIG. 13G shows this state.

Thereafter, a rear-surface-side insulating film 111 made of silicon oxide is formed on the whole of the rear surface Wr of the wafer W, and then a part of the insulating film 111, with which the penetration electrode 109, the diffusion preventing film 105, and the insulating film 104 are covered, is ground, is removed, and is exposed (see FIG. 13H). Thereafter, the wafer W is cut into semiconductor chips, each having the penetration electrode 109.

Semiconductor chips obtained according to the manufacturing method described above are stacked together in the longitudinal direction, and the bump 108 of each of the adjoining semiconductor chips is joined to the penetration electrode 109 of the adjoining semiconductor chip, the penetration electrode 109 being exposed at the rear surface Wr of the wafer W, whereby the semiconductor chips can be electrically connected together. Therefore, the wiring length can be shortened. In the thus structured semiconductor device, the mounting area with respect to, for example, the wiring substrate is small.

However, according to the conventional method for manufacturing a semiconductor chip that has a penetration electrode 109, not only the wafer W but also the metal film 106 (the penetration electrode 109) is ground when the rear surface Wr of the wafer W is ground (see FIG. 13F). Therefore, the copper forming the metal film 106 reaches to a deep part of the wafer W from the rear surface Wr of the wafer W because of diffusion, and remains in the wafer W even if a grinding damage layer is removed (see FIG. 13G). Thus, the wafer W is contaminated, and the properties of the semiconductor chip are deteriorated.

SUMMARY OF THE INVENTION

It is an object of the present invention to provide a method for manufacturing a semiconductor chip capable of restraining the metal contamination of a semiconductor substrate caused by forming a penetration electrode.

It is another object of the present invention to provide a semiconductor device having a semiconductor chip excellent in properties while having a penetration electrode.

It is still another object of the present invention to provide a method for manufacturing a semiconductor device capable of restraining the metal contamination of a semiconductor chip caused by forming a penetration electrode.

It is still another object of the present invention to provide a semiconductor chip capable of excellently transmitting a light signal through a through-hole formed in a semiconductor substrate and to provide a method for manufacturing the semiconductor chip.

A method for manufacturing a semiconductor chip according to a first aspect of the present invention includes a step of forming a front-surface-side concave portion in a semiconductor substrate having a front surface and a rear surface, a functional device being formed on the front surface, the front-surface-side concave portion being formed in the front surface and having a predetermined depth smaller than a thickness of the semiconductor substrate; a dummy plug forming step of supplying nonmetallic material into the front-surface-side concave portion and embedding a dummy plug made of the nonmetallic material in the front-surface-side concave portion; a thinning step of, subsequent to the dummy plug forming step, removing a part of the rear surface of the semiconductor substrate and thinning the semiconductor substrate so that the thickness of the semiconductor substrate becomes smaller than the depth of the front-surface-side concave portion and so that the front-surface-side concave portion is formed into a through-hole that penetrates the semiconductor substrate; a dummy plug removing step of removing the dummy plug provided in the through-hole; and a step of, subsequent to the dummy plug removing step, supplying metallic material into the through-hole and forming a penetration electrode that establishes an electrical connection between a front surface side and a rear surface side of the semiconductor substrate and that is electrically connected to the functional device.

According to this invention, the dummy plug made of nonmetallic material is provided and metallic material is not provided in the front-surface-side concave portion (through-hole) when the thinning step is executed. Therefore, metal atoms are never diffused from the rear surface of the semiconductor substrate into the semiconductor substrate when ground, for example, even if the thinning step is to physically grind the rear surface of the semiconductor substrate. In other words, the metal contamination of the semiconductor substrate caused by the formation of the penetration electrode can be prevented. Therefore, according to the manufacturing method of the present invention, a semiconductor chip that has less metal contamination and that exhibits excellent properties can be produced while having a penetration electrode.

A semiconductor chip that has a penetration electrode that penetrates a semiconductor substrate in the thickness direction can be obtained by supplying metallic material into a through-hole from which a dummy plug has been removed. This penetration electrode makes it possible to establish an electrical connection in a short distance between the front surface side and the rear surface side of the semiconductor substrate.

The nonmetallic material forming the dummy plug may be a polymer, for example.

If the thinning step is to physically grind the rear surface of the semiconductor substrate, this semiconductor chip manufacturing method may additionally include a step of, subsequent to the thinning step, removing a grinding damage layer having grinding marks or damage caused by the thinning step.

Preferably, this semiconductor chip manufacturing method includes a step of, subsequent to the dummy plug removing step and prior to the penetration electrode forming step, forming an insulating film on the inner wall of the through-hole. In this case, in the resulting semiconductor chip, an insulating film is interposed between the penetration electrode and the semiconductor substrate, and this insulating film establishes electrical insulation between the penetration electrode and the semiconductor substrate.

Preferably, this semiconductor chip manufacturing method includes a step of, subsequent to the dummy plug removing step and prior to the penetration electrode forming step, forming a diffusion preventing film, which prevents metal atoms from being diffused from the inside of the through-hole into the semiconductor substrate, on the inner wall of the through-hole. In this case, in the resulting semiconductor chip, a diffusion preventing film is interposed between the penetration electrode and the semiconductor substrate, and this diffusion preventing film can prevent metal atoms from being diffused from the penetration electrode into the semiconductor substrate and can prevent a deterioration in the properties of the semiconductor chip.

The penetration electrode forming step may include, for example, a step of supplying metallic material into the through-hole by electrolytic plating. In this case, a step of forming a seed layer on the inner wall of the through-hole may be carried out before supplying the metallic material.

The semiconductor chip manufacturing method of the present invention may further include a step of, subsequent to the dummy plug forming step and prior to the dummy plug removing step, forming a wiring member that comes into contact with an exposed surface of the dummy plug on the front surface side of the semiconductor substrate and that is electrically connected to the functional device.

According to this arrangement, since the wiring member is formed to come into contact with the exposed surface of the dummy plug on the front surface side of the semiconductor substrate, a penetration electrode electrically connected to the wiring member is formed by supplying metallic material into the through-hole from which the dummy plug has been removed. Since the wiring member is electrically connected to the functional device, the penetration electrode electrically connected to the functional device can be easily produced according to this method.

The dummy plug forming step may include a photosensitive resin filling step of filling an inside of the front-surface-side concave portion with photosensitive resin having nonconductivity as the nonmetallic material so as to form the dummy plug made of the photosensitive resin and an exposure step of exposing the dummy plug to light so that a predetermined outer peripheral part of the dummy plug along a whole inner wall surface of the front-surface-side concave portion is insoluble in a predetermined etching medium and so that a central part of the dummy plug inward from the outer peripheral part is soluble in the predetermined etching medium. In this case, the dummy plug removing step may include a development step of removing the central part of the dummy plug according to etching using the predetermined etching medium.

According to this arrangement, the entire dummy plug is not removed by the development step, and the outer peripheral part of the dummy plug along the whole inner wall surface of the front-surface-side concave portion is left. Since the dummy plug is made of insulating material, the outer peripheral part of the dummy plug that remains there without being removed is interposed between the penetration electrode and the semiconductor substrate, and serves as an insulating film that establishes electrical insulation between the penetration electrode and the semiconductor substrate in the resulting semiconductor chip.

The insulating film can be formed to have a desired thickness by controlling the exposure area of the dummy plug in the exposure step. Therefore, a thick insulating film having sufficient nonconductivity can be easily formed.

The photosensitive resin may be so-called positive type photosensitive resin which is insoluble in a predetermined etching medium, and an exposed part of which is soluble therein, or may be so-called negative type photosensitive resin which is soluble in a predetermined etching medium, and an exposed part of which is insoluble therein.

To restrict an exposure area, a resist with a predetermined pattern may be used. The exposure area may be restricted by a substance other than the resist. For example, if a front-surface-side concave portion is formed by reactive ion etching using a hard mask having an opening, this front-surface-side concave portion will have a width slightly greater than the width of the opening. Therefore, the hard mask is projected inward slightly from the edge of the front-surface-side concave portion. The exposure area with respect to the photosensitive resin (dummy plug) in the front-surface-side concave portion may be restricted by using this projection of the hard mask.

A semiconductor device manufacturing method according to a second aspect of the present invention includes a producing step of producing a plurality of semiconductor chips and a stacking step of stacking the plurality of semiconductor chips together. The semiconductor chip producing step includes a step of forming a front-surface-side concave portion in a semiconductor substrate having a front surface and a rear surface, a functional device being formed on the front surface, the front-surface-side concave portion being formed in the front surface and having a predetermined depth smaller than a thickness of the semiconductor substrate; a dummy plug forming step of supplying nonmetallic material into the front-surface-side concave portion and embedding a dummy plug made of the nonmetallic material in the front-surface-side concave portion; a thinning step of, subsequent to the dummy plug forming step, removing a part of the rear surface of the semiconductor substrate and thinning the semiconductor substrate so that the thickness of the semiconductor substrate becomes smaller than the depth of the front-surface-side concave portion and so that the front-surface-side concave portion is formed into a through-hole that penetrates the semiconductor substrate; a dummy plug removing step of removing the dummy plug provided in the through-hole; and a step of, subsequent to the dummy plug removing step, supplying metallic material into the through-hole and forming a penetration electrode that establishes an electrical connection between a front surface side and a rear surface side of the semiconductor substrate and that is electrically connected to the functional device.

The metal contamination of the semiconductor chip caused by the formation of the penetration electrode can be prevented according to the step of producing a plurality of semiconductor chips. Therefore, according to this semiconductor device manufacturing method, it is possible to obtain a semiconductor device that has semiconductor chips each of which has a penetration electrode and is small in metal contamination.

The penetration electrode can realize an electrical connection in a short distance between a functional device of one of two adjoining semiconductor chips stacked together and a functional device of the other semiconductor chip.

A method for manufacturing a semiconductor device according to a third aspect of the present invention includes a step of forming a front-surface-side concave portion in a first semiconductor substrate having a front surface and a rear surface, a functional device being formed on the front surface, the front-surface-side concave portion being formed in the front surface and having a predetermined depth smaller than a thickness of the first semiconductor substrate; a dummy plug forming step of supplying nonmetallic material into the front-surface-side concave portion and embedding a dummy plug made of the nonmetallic material in the front-surface-side concave portion; a stacking step of stacking the first semiconductor substrate on a second semiconductor substrate while causing the front surface of the first semiconductor substrate in which the dummy plug is formed to face one surface of the second semiconductor substrate; a thinning step of removing a part of the rear surface of the first semiconductor substrate stacked on the second semiconductor substrate and thinning the first semiconductor substrate so that the thickness of the first semiconductor substrate becomes smaller than the depth of the front-surface-side concave portion and so that the front-surface-side concave portion is formed into a through-hole that penetrates the first semiconductor substrate; a dummy plug removing step of, subsequent to the thinning step, removing the dummy plug provided in the through-hole; and a metallic material supplying step of, subsequent to the dummy plug removing step, supplying metallic material into the through-hole and forming a penetration electrode that establishes an electrical connection between a front surface side and a rear surface side of the first semiconductor substrate and that is electrically connected to the functional device.

According to this invention, the dummy plug made of nonmetallic material is provided and metallic material is not provided in the front-surface-side concave portion (through-hole) when the thinning step is executed. Therefore, metal atoms are never diffused from the rear surface of the first semiconductor substrate into the first semiconductor substrate when ground, for example, even if the thinning step is to physically grind the rear surface of the first semiconductor substrate. In other words, the metal contamination of the first semiconductor substrate caused by the formation of the penetration electrode can be prevented.

Therefore, according to this semiconductor device manufacturing method, it is possible to produce a semiconductor device having a semiconductor chip (the first semiconductor substrate or a semiconductor substrate formed by cutting the first semiconductor substrate) that has a penetration electrode and less metal contamination.

According to this semiconductor device manufacturing method, the first semiconductor substrate is thinned while being stacked on the second semiconductor substrate, so as to form a penetration electrode. Therefore, there is no need to stack the first semiconductor substrate, which has undergone the thinning step, on the second semiconductor substrate.

This semiconductor device manufacturing method may further include a step of, prior to the stacking step, forming a dummy bump that juts from the front surface of the first semiconductor substrate and that comes into contact with the dummy plug. In this case, the second semiconductor substrate may include a wiring member provided on the one surface of the second semiconductor substrate. In this case, the stacking step may include a dummy bump contact step of bringing the dummy bump into contact with the wiring member of the second semiconductor substrate and a step of disposing tracing material in such a manner as to cover a periphery of the dummy bump being in contact with the wiring member of the second semiconductor substrate. In this case, the dummy plug removing step may include a step of removing the dummy bump. In this case, the metallic material supplying step may include a step of supplying metallic material to a space that communicates with the through-hole and that is defined by the tracing material and forming a bump that is formed integrally with the penetration electrode and that juts from the front surface of the first semiconductor substrate.

According to this arrangement, since the dummy bump comes into contact with the wiring member of the second semiconductor substrate by the dummy bump contact step, the wiring member of the second semiconductor substrate is exposed in the space defined by the tracing material after the dummy bump has been removed. Therefore, when metallic material is supplied into the space defined by the tracing material after the dummy bump has been removed so as to form a bump by the metallic material supplying step, this bump is electrically connected to the wiring member of the second semiconductor substrate. In other words, according to this manufacturing method, a bump can be formed simultaneously when a penetration electrode is formed, and an electrical connection can be established between the bump and the wiring member of the second semiconductor substrate when the bump is formed.

For example, the tracing material may be an adhesive to bond the front surface of the first semiconductor substrate and the one surface of the second semiconductor substrate together.

The wiring member of the second semiconductor substrate may include a penetration electrode that penetrates the second semiconductor substrate in a thickness direction thereof. In this case, the dummy bump contact step may include a step of bringing the dummy bump into contact with the penetration electrode penetrating the second semiconductor substrate.

Thereby, it is possible to obtain a semiconductor device in which the bump of the first semiconductor substrate is electrically connected to the penetration electrode of the second semiconductor substrate.

A semiconductor device according to a fourth aspect of the present invention comprises a first semiconductor chip and a second semiconductor chip. The first semiconductor chip includes a semiconductor substrate having a front surface and a rear surface; a functional device formed on the front surface of the semiconductor substrate; a penetration electrode that is electrically connected to the functional device, that is disposed in a through-hole penetrating the semiconductor substrate in the thickness direction beside the functional device, and that establishes an electrical connection between a front surface side and a rear surface side of the semiconductor substrate; and a bump that is formed integrally with the penetration electrode and that juts from the front surface of the semiconductor substrate. The second semiconductor chip includes a wiring member that is formed on one surface of the second semiconductor chip facing the front surface of the semiconductor substrate and that is bonded with the bump of the first semiconductor chip.

A semiconductor chip manufacturing method according to a fifth aspect of the present invention includes a step of forming a front-surface-side concave portion in a semiconductor substrate having a front surface and a rear surface, a light emitting element or a light receiving element being formed on the front surface, the front-surface-side concave portion being formed in the front surface and having a predetermined depth smaller than a thickness of the semiconductor substrate; a plug forming step of supplying transparent material into the front-surface-side concave portion and embedding a plug made of the transparent material in the front-surface-side concave portion; and a thinning step of, subsequent to the plug forming step, removing a part of the rear surface of the semiconductor substrate and thinning the semiconductor substrate so that the thickness of the semiconductor substrate becomes smaller than the depth of the front-surface-side concave portion and so that the front-surface-side concave portion is formed into a through-hole that penetrates the semiconductor substrate.

According to this invention, a through-hole penetrating the semiconductor substrate in the thickness direction can be obtained by the thinning step. A plug made of transparent material is embedded in the through-hole. The transparent material mentioned here denotes material that can transmit light (which includes invisible light, such as infrared light, as well as visible light) emitted from the light emitting element or material that can transmit light (which includes invisible light, such as infrared light, as well as visible light) having a wave length range that can be received by the light receiving element.

Therefore, light emitted from the light emitting element formed on the front surface of the semiconductor substrate can be guided to the rear-surface side of the semiconductor substrate through the through-hole (waveguide) in which transparent material is embedded, or light guided from the rear-surface side of the semiconductor substrate can be received by the light receiving element formed on the front surface of the semiconductor substrate through the through-hole. Thus, a light signal can be transmitted through the through-hole.

There is a conventional semiconductor device in which an interposer is provided with an LSI module formed on its one surface and communicates with a mounting board by a light signal. In this conventional semiconductor device, a chip having a light emitting element or a light receiving element is provided on the side of the other surface of the interposer (i.e., on the side opposite the LSI module). This chip and the LSI module are electrically connected to each other through a penetration electrode provided in the interposer and through a photoelectrical-signal-transforming driver IC chip mounted on the one surface of the interposer.

The thus structured conventional semiconductor device has difficulty in achieving a reduction in size, because chips are disposed on both sides of the interposer.

Since the semiconductor chip produced according to the manufacturing method of this invention can send and receive a light signal between the front-surface side and the rear-surface side of the semiconductor substrate through the through-hole, a light signal can be sent and received between the light emitting element or the light receiving element and the mounting board even if this semiconductor chip is mounted on the mounting board in the state of causing the rear-surface side of the semiconductor substrate to face the mounting board.

Therefore, it is possible to realize a semiconductor device in which this semiconductor chip is used as an interposer, and the LSI module is mounted on the front surface side of the semiconductor substrate, and hence communication by a light signal can be achieved with the mounting board placed on the side of one surface thereof while having the light emitting element or the light receiving element and the LSI module on the side of the other surface thereof. Moreover, the photoelectrical-signal-transforming driver IC chip, in addition to the light emitting element or the light-receiving element, can be formed in the semiconductor substrate (the front surface), not as a chip separated from the semiconductor substrate. Therefore, the semiconductor device can be reduced in size.

Additionally, in the conventional semiconductor device having the interposer, the position accuracy of the chip having the light emitting element or the light receiving element with respect to the mounting board depends not only on the mounting accuracy of the chip having the light emitting element or the light receiving element with respect to the interposer but also the mounting accuracy of the interposer with respect to the mounting board. Therefore, it was impossible to enhance the position accuracy of the chip having the light emitting element or the light receiving element with respect to the mounting board.

Likewise, there is a signal-processing semiconductor device in which a chip having a light emitting element or a light receiving element is mounted on one surface of a substrate having a through-hole, and light is transmitted between the light emitting element or the light receiving element and the other-surface side of the substrate through the through-hole. In this case, sometimes, light cannot excellently pass through the through-hole, and a light signal cannot be processed if the mounting accuracy of the chip having the light emitting element or the light receiving element is low with respect to the substrate having the through-hole.

According to this invention, since the light emitting element or the light receiving element can be directly formed in the semiconductor substrate, the position accuracy of the light emitting element or the light receiving element with respect to the semiconductor substrate can be enhanced. Therefore, when this semiconductor chip is mounted on the mounting board, the position accuracy of the light emitting element or the light receiving element with respect to the mounting board can be enhanced.

Additionally, according to this invention, a semiconductor chip characterized in that a through-hole and a light emitting element or a light receiving element are formed in the single chip is produced. Therefore, unlike a case in which a chip having a light emitting element or a light receiving element is mounted on a substrate having a through-hole, the mounting accuracy of a chip does not become a problem. That is, according to this manufacturing method, it is possible to produce a semiconductor chip capable of excellently transmitting a light signal through a through-hole formed in a semiconductor substrate.

If three or more semiconductor chips each of which has a light emitting element or a light receiving element and has no through-hole are stacked together, a light signal was unable to be directly transmitted between two semiconductor chips not adjacent to each other.

In contrast, the semiconductor chip produced by this invention can transmit a light signal through the through-hole, and hence, even when three or more semiconductor chips each of which is the one produced by this invention are stacked together, a light signal can be directly transmitted between the two semiconductor chips not adjacent to each other.

This semiconductor chip manufacturing method may further include a step of forming a member that establishes a light path between the light emitting element or the light receiving element and the rear surface side of the semiconductor substrate through the through-hole beside the light emitting element or the light receiving element.

Thereby, even when light emitted from the light emitting element is not directly guided to the rear surface side of the semiconductor substrate through the through-hole, the light path between the light emitting element and the rear surface side of the semiconductor substrate through the through-hole can be established by the light path establishing member. Likewise, even when light guided from the rear surface side of the semiconductor substrate through the through-hole is not directly received by the light receiving element, the light path between the rear surface side of the semiconductor substrate and the light receiving element through the through-hole can be established by the light path establishing member.

A semiconductor chip manufacturing method according to a sixth aspect of the present invention includes a step of forming a front-surface-side concave portion in a semiconductor substrate having a front surface and a rear surface, a light emitting element or a light receiving element being formed on the front surface, the front-surface-side concave portion being formed in the front surface and having a predetermined depth smaller than a thickness of the semiconductor substrate; a dummy plug forming step of supplying a filler into the front-surface-side concave portion and embedding a dummy plug made of the filler in the front-surface-side concave portion; a thinning step of, subsequent to the dummy plug forming step, removing a part of the rear surface of the semiconductor substrate and thinning the semiconductor substrate so that the thickness of the semiconductor substrate becomes smaller than the depth of the front-surface-side concave portion and so that the front-surface-side concave portion is formed into a through-hole that penetrates the semiconductor substrate; and a dummy plug removing step of, subsequent to the thinning step, removing the dummy plug provided in the through-hole.

According to this invention, when the thinning step is executed, since the dummy plug is embedded in the front-surface-side concave portion (through-hole), grinding waste can be prevented from coming into the through-hole, for example, even if the thinning step is to physically grind the rear surface of the semiconductor substrate.

On the other hand, since the dummy plug embedded in the through-hole is removed after the through-hole is formed according to the thinning step, light can pass through this through-hole even if the filler does not have transparency. Therefore, light can be transmitted between the light emitting element or the light receiving element formed on the front surface of the semiconductor substrate and the rear surface side of the semiconductor substrate through the through-hole.

The semiconductor chip produced according to the manufacturing method enables a size reduction of a semiconductor device using this semiconductor chip as an interposer. Additionally, since a light signal can be transmitted through the through-hole, when three or more semiconductor chips each of which is the semiconductor chip produced according to the manufacturing method are stacked together, the light signal can be directly transmitted between two semiconductor chips not adjacent to each other.

Additionally, since the through-hole and the light emitting element or the light receiving element are formed on the single chip, the mounting accuracy of the chip does not become a problem, unlike a case in which a chip having a light emitting element or a light receiving element is mounted on a substrate having a through-hole. In other words, it is possible to produce a semiconductor chip capable of excellently transmitting a light signal through a through-hole formed in the semiconductor substrate by this semiconductor chip manufacturing method.

A semiconductor chip according to a seventh aspect of the present invention comprises a semiconductor substrate having a front surface and a rear surface; a light emitting element or a light receiving element formed on the front surface of the semiconductor substrate; and a member that establishes a light path between the light emitting element or the light receiving element and a rear surface side of the semiconductor substrate through a through-hole penetrating the semiconductor substrate in a thickness direction thereof beside the light emitting element or the light receiving element.

This semiconductor chip can be produced by executing a step of forming a member that establishes a light path between the light emitting element or the light receiving element and the rear surface side of the semiconductor substrate through the through-hole in the semiconductor chip manufacturing method mentioned above.

For example, a member that reflects light emitted from the light emitting element toward the rear surface side of the semiconductor substrate through the through-hole or a member that reflects light guided from the rear surface side of the semiconductor substrate to the front surface side of the semiconductor substrate through the through-hole toward the light receiving element, such as a prism or a mirror, can be used as the light path establishing member.

The aforementioned objects, other objects, features, and advantageous effects of the present invention will become apparent from the following description of embodiments given with reference to the accompanying drawings.

DESCRIPTION OF THE PREFERRED EMBODIMENTS

Figure 1:
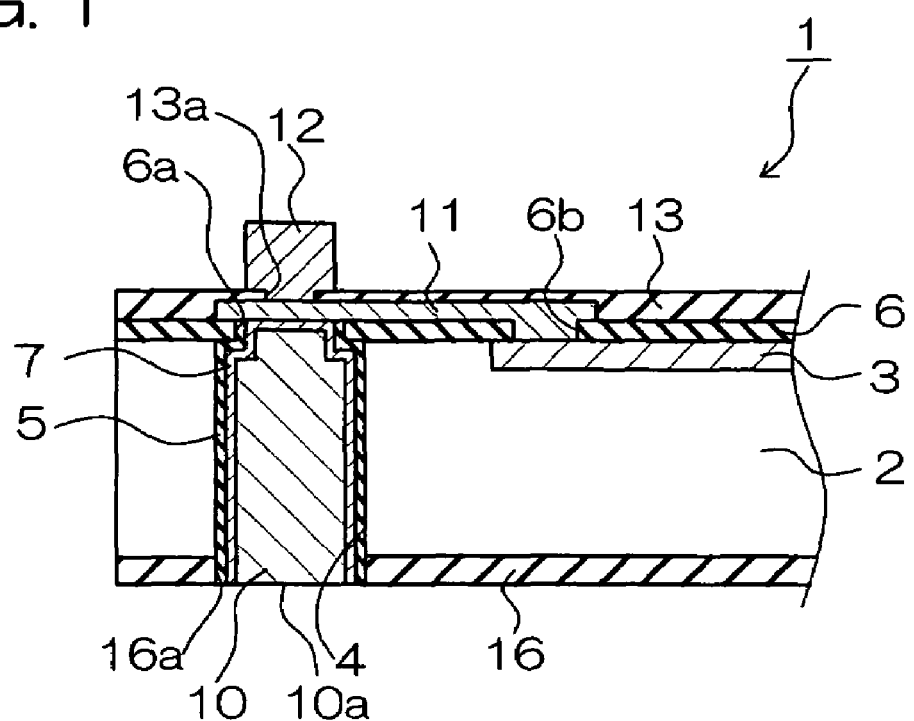
FIG. 1 is a diagrammatic sectional view showing a structure of a semiconductor chip produced by a manufacturing method according to a first embodiment of the present invention.

FIG. 1 is a diagrammatic sectional view showing a structure of a semiconductor chip produced by a manufacturing method according to a first embodiment of the present invention.

This semiconductor chip 1 includes a semiconductor substrate 2 made of silicon, for example. A functional device (an active element such as a transistor or a passive element such as a resistor or a capacitor) 3 that has a plurality of electrodes is formed on one surface (hereinafter, referred to as "front surface") of the semiconductor substrate 2. A through-hole 4 that penetrates the semiconductor substrate 2 in a thickness direction is formed beside the functional device 3.

A hard mask 6 made of, for example, silicon oxide is formed on the front surface of the semiconductor substrate 2. The hard mask 6 has an opening 6a and a contact hole 6b. The opening 6a is formed in a region where the opening 6a substantially coincides with the through-hole 4 when viewed perpendicularly to the front surface of the semiconductor substrate 2. A predetermined region (one of the electrodes) of the functional device 3 appears inside the contact hole 6b. The width of the opening 6a is slightly smaller than that of the through-hole 4. On the side of the front surface of the semiconductor substrate 2, the hard mask 6 slightly juts inward from the edge of the through-hole 4.

A wiring member 11 is formed in a continuous region including the opening 6a and the contact hole 6b when viewed perpendicularly to the front surface of the semiconductor substrate 2. The wiring member 11 is extended from above the hard mask 6 in such a way as to stop up the opening 6a. The wiring member 11 is electrically connected to the functional device 3 by filling the contact hole 6b therewith.

A front-surface protecting film 13 made of silicon oxide or silicon nitride ($Si_3N_4$) is formed on the surface of the wiring member 11 and the surface of the hard mask 6. The front-surface protecting film 13 has an opening 13a in a predetermined region on the wiring member 11. The opening 13a is formed so as to substantially coincide with the opening 6a of the hard mask 6 when viewed perpendicularly to the front surface of the semiconductor substrate 2. A bump (projection electrode) 12 jutting from the surface of the front-surface protecting film 13 is joined to the wiring member 11 through the opening 13a.

A rear-surface protecting film 16 that has an opening 16a and that is made of silicon oxide or silicon nitride is formed on a surface (hereinafter, referred to as "rear surface") opposite the front surface of the semiconductor substrate 2. The opening 16a is formed so as to substantially coincide with the through-hole 4 when viewed perpendicularly to the front surface of the semiconductor substrate 2. The inner wall surface of the through-hole 4 and the inner wall surface of the opening 16a are formed continuously.

An insulating film 5 made of silicon oxide ($SiO_2$) is formed on the inner wall surface of the through-hole 4, the inner wall surface of the opening 6a, and the inner wall surface of the opening 16a. A continuous diffusion-preventing film 7 made of conductive material, such as titanium-tungsten (TiW), tantalum nitride (TaN), or titanium nitride (TiN), is formed on the insulating film 5 and on the surface of the wiring member 11 appearing inside the opening 6a.

The inner region of the diffusion preventing film 7 in the through-hole 4 and in the openings 6a and 16a is filled with a penetration electrode 10 made of, for example, copper. Therefore, the insulating film 5 and the diffusion preventing film 7 are interposed between the penetration electrode 10 and the semiconductor substrate 2. The penetration electrode 10 is electrically insulated from the semiconductor substrate 2 by means of the insulating film 5. The diffusion preventing film 7 is made of material by which metal atoms (copper) constituting the penetration electrode 10 can be prevented from being diffused to the semiconductor substrate 2.

On the side of the rear surface of the semiconductor substrate 2, each of the penetration electrode 10, the diffusion preventing film 7, and the insulating film 5 has an exposed end face substantially flush with the surface of the rear-surface protecting film 16. The exposed end face of the penetration electrode 10 serves as a rear-side connection surface 10a used to be electrically connected to other semiconductor chips or to wiring substrates.

The functional device 3 is electrically connected to the bump 12 disposed on the front-surface side of the semiconductor substrate 2 through the wiring member 11, and is electrically connected to the rear-side connection surface 10a disposed on the rear-surface side of the semiconductor substrate 2 through the wiring member 11, through the diffusion preventing film 7, and through the penetration electrode 10. The bump 12 and the rear-side connection surface 10a are electrically connected to each other through the wiring member 11, the diffusion preventing film 7, and the penetration electrode 10.

Accordingly, an electrical connection can be made from the front-surface side of the semiconductor chip 1 (i.e., the front-surface side of the semiconductor substrate 2) to the functional device 3 through the bump 12. Likewise, an electrical connection can be made from the rear-surface side of the semiconductor chip 1 (i.e., the rear-surface side of the semiconductor substrate 2) to the functional device 3 through the rear-side connection surface 10a. The wiring length between the front-surface side and the rear-surface side of the semiconductor chip 1 is shortened by the penetration electrode 10 that penetrates the semiconductor substrate 2.

Additionally, since the diffusion preventing film 7 is interposed between the penetration electrode 10 and the semiconductor substrate 2, copper atoms constituting the penetration electrode 10 are prevented from being diffused into the semiconductor substrate 2, so as not to deteriorate the properties of the semiconductor chip 1.

FIGS. 2A to 2I are diagrammatic sectional views for explaining a method for manufacturing the semiconductor chip 1 of FIG. 1. A plurality of semiconductor chips 1 are produced from a single semiconductor wafer (hereinafter, referred to as simply as "wafer") W. However, only a part of a piece that corresponds to one semiconductor chip 1 in the wafer W is shown in FIGS. 2A to 2I. The wafer W of FIGS. 2A to 2I has a plurality of regions, each of which corresponds to the finished semiconductor chip 1 shown in FIG. 1, formed tightly in the in-plane direction of the wafer W.

A hard mask 6 that is made of, for example, silicon oxide and that has an opening 6a in its predetermined part is formed on one surface (hereinafter, referred to as "front surface") of a semiconductor wafer W (hereinafter, referred to simply as "wafer") on which the functional device 3 is formed. The opening 6a is formed such that a region beside the functional device 3 is exposed in the wafer W.

Thereafter, a front-surface-side concave portion 9 is formed in the region beside the functional device 3 according to reactive ion etching (RIE) through the opening 6a of the hard mask 6. The front-surface-side concave portion 9 has a predetermined depth (for example, 70 µm) that is smaller than the thickness of the wafer W (i.e., that does not penetrate the wafer W). As a result of the formation of the front-surface-side concave portion 9 according to reactive ion etching, the front-surface-side concave portion 9 has a width slightly greater than the width of the opening 6a. Therefore, the hard mask 6 slightly juts inward from the edge of the front-surface-side concave portion 9.

Thereafter, a contact hole 6b by which one of the electrodes of the functional device 3 is exposed is formed in the hard mask 6. The contact hole 6b can be formed by etching the hard mask 6, for example, through a resist film (not shown) that has an opening in a region corresponding to the contact hole 6b.

Figure 2A:
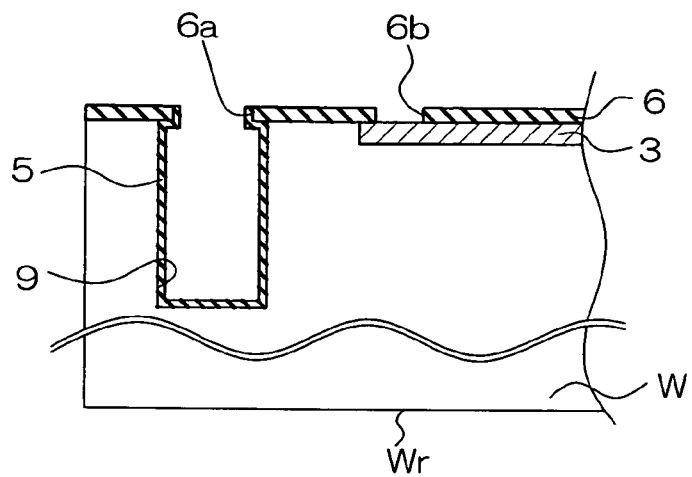
FIG. 2A to FIG. 2I are diagrammatic sectional views for explaining the manufacturing method of a semiconductor device shown in FIG. 1.

Thereafter, an insulating film 5 made of silicon oxide is formed on the exposed surface of the inside of the opening 6a and of the inside of the front-surface-side concave portion 9 according to a CVD (Chemical Vapor Deposition) method. The insulating film 5 can be formed on the exposed surface of the inside of the opening 6a and of the inside of the concave portion 9, for example, by forming a resist film (not shown) having an opening that exposes the opening 6a and the front-surface-side concave portion 9, by forming an insulating film on the whole surface on the front-surface side of the wafer W in this state, and by removing the resist film. FIG. 2A shows this state.

Figure 2B:
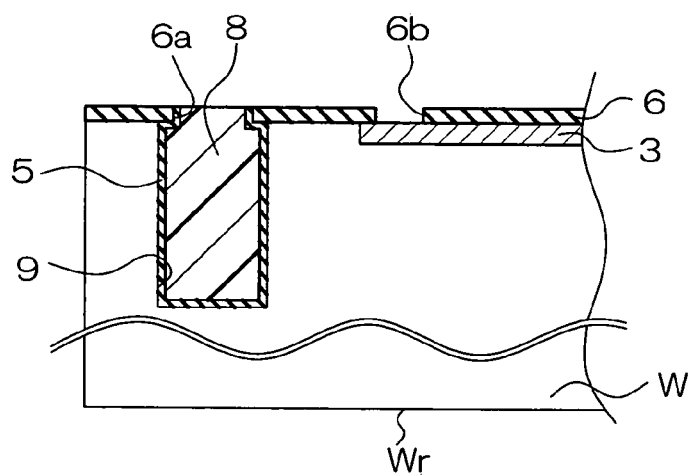

Thereafter, the inside of the front-surface-side concave portion 9 and the inside of the opening 6a are filled with non-metallic material, such as a polymer, whereby a dummy plug 8 is formed (see FIG. 2B). The exposed surface of the dummy plug 8 exposed from the opening 6a and the surface of the hard mask 6 are substantially flush with each other.

Thereafter, a wiring member 11 is formed in a region ranging from the inside of the contact hole 6b to the dummy plug 8. To form the wiring member 11, metallic material is first applied onto the whole surface on the front-surface side of the wafer W that has under gone the foregoing process. The metallic material is filled in the contact hole 6b, and is brought into contact with one of the electrodes of the functional device 3 exposed at the inside of the contact hole 6b. Thereafter, a part of the metallic material other than a continuous region including the opening 6a and the contact hole 6b (i.e., a region corresponding to the wiring member 11 (see FIG. 1)), when viewed perpendicularly to the front surface of the semiconductor substrate 2, is removed by an etching operation that uses a resist film of a predetermined pattern, thus obtaining the wiring member 11 electrically connected to the functional device 3.

Figure 2C:
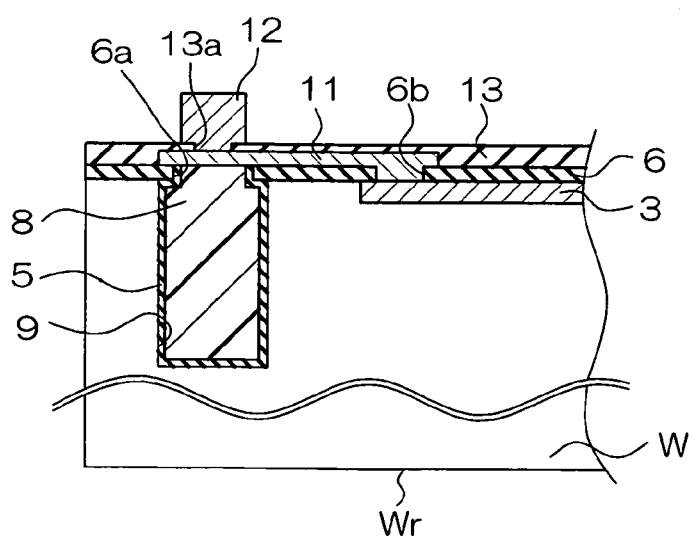

Further, a front-surface protecting film 13 is formed on the whole surface on the front-surface side of the wafer W that has undergone the foregoing process, i.e., on the hard mask 6 and the wiring member 11. An opening 13a is then formed in the front-surface protecting film 13 in a region on the opening 6a. A bump 12 joined to the wiring member 11 through the opening 13a is then formed. FIG. 2C shows this state.

Figure 2D:
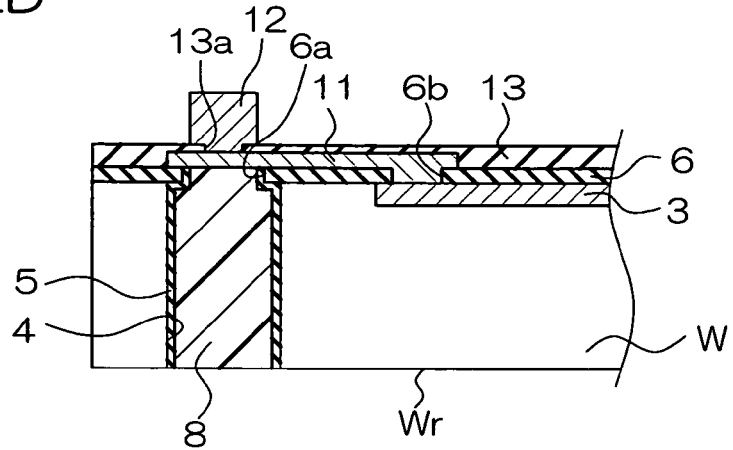

Thereafter, the front surface of the wafer W (i.e., the surface on which the functional device 3 is formed) is stuck onto a supporter not shown, whereas the rear surface Wr of the wafer W (i.e., the surface opposite the front surface) is mechanically ground, whereby the wafer W is thinned. As a result, the dummy plug 8 is exposed at the rear surface Wr of the wafer W, and the front-surface-side concave portion 9 is formed into the through-hole 4 that penetrates the wafer W in the thickness direction. FIG. 2D shows this state.

Figure 2E:
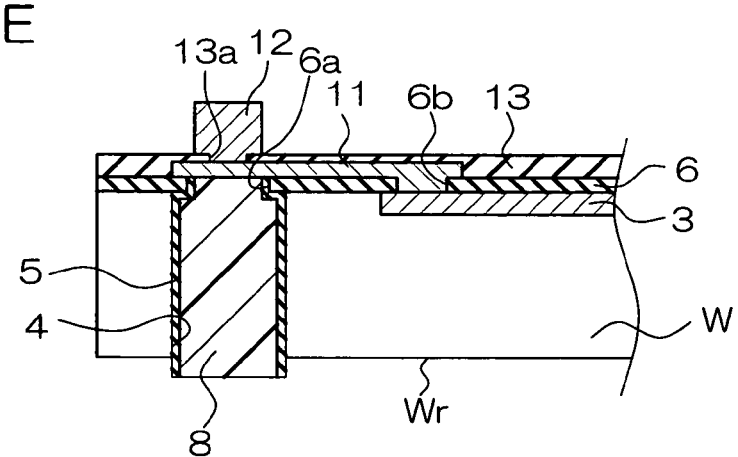

A grinding damage layer that has grinding marks or damage caused when ground exists on the rear surface Wr of the wafer W. To remove the grinding damage layer, the rear surface Wr of the wafer W is subjected to dry etching or wet etching by approximately 5 µm. At this time, the dummy plug 8 and the insulating film 5 are hardly etched, and jut from the rear surface Wr of the wafer W. FIG. 2E shows this state.

Thereafter, a rear-surface protecting film 16 made of silicon oxide or silicon nitride is formed on the whole surface on the rear-surface Wr side of the wafer W that has undergone the foregoing process. In this state, the projections of the dummy plug 8 and of the insulating film 5 jutting from the rear surface Wr of the wafer W are covered with the rear-surface protecting film 16.

Figure 2F:
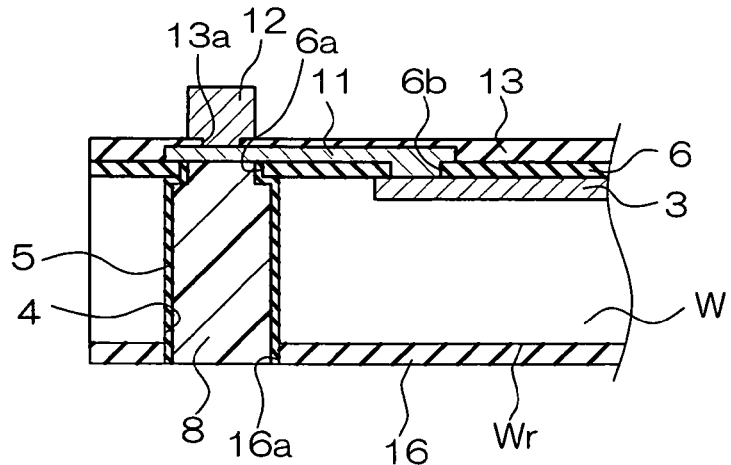
Figure 2G:
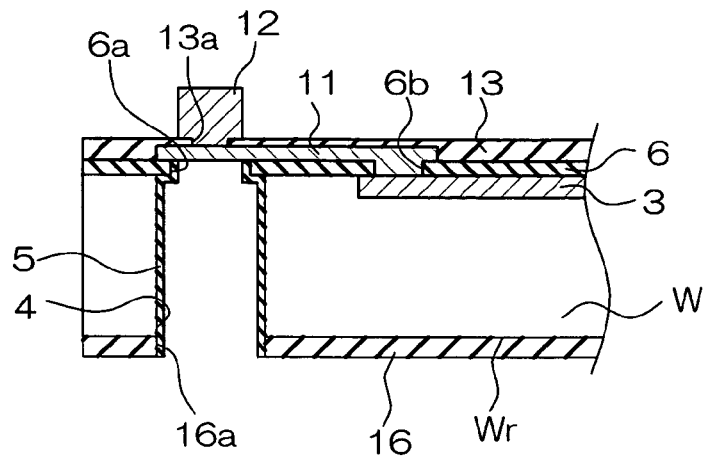

Thereafter, the rear surface Wr of the wafer W is mechanically ground, so that the end faces of the projections of the dummy plug 8 and of the insulating film 5 are exposed from the rear-surface protecting film 16. As a result, an opening 16a that has an inner wall surface contiguous to the inner wall surface of the through-hole 4 is formed in the rear-surface protecting film 16. On the side of the rear surface Wr of the wafer W, the surface of the rear-surface protecting film 16 is made substantially flush with the exposed end face of the dummy plug 8 and the exposed end face of the insulating film 5 by grinding the rear surface Wr of the wafer W. FIG. 2F shows this state.

Thereafter, the dummy plug 8 inside the through-hole 4 and the openings 6a and 16a is removed, for example, by an etching operation that uses an appropriate solvent. As a result, the wiring member 11 is exposed at the bottom (on the side of the bump 12) of the opening 6a (see FIG. 2G).

Figure 2H:
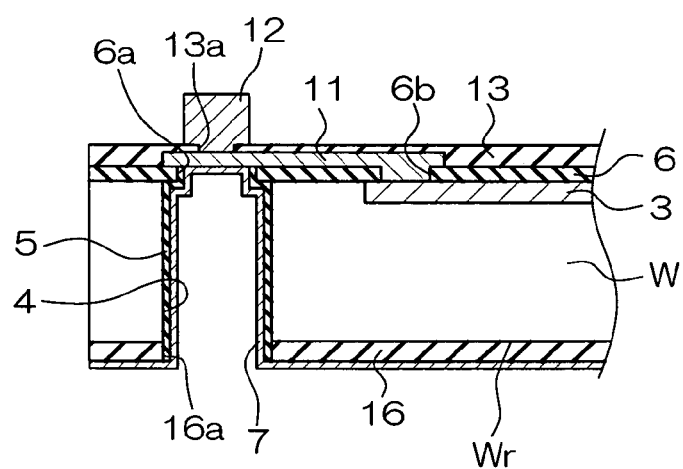

Thereafter, the diffusion preventing film 7 is formed on the whole exposed surface on the side of the rear surface Wr of the wafer W that has undergone the foregoing process, i.e., the surface of the rear-surface protecting film 16, on the inner wall surface (on the insulating film 5) of the through-hole 4 and the openings 6a and 16a, and the surface exposed from the opening 6a of the wiring member 11. FIG. 2H shows this state.

Figure 2I:
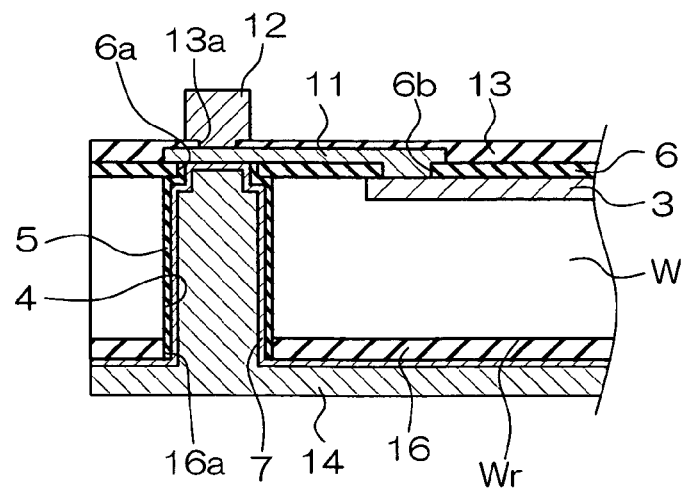

Further, a seed layer (not shown) made of copper is formed on the diffusion preventing film 7. A copper film 14 is then formed thereon by electrolytic plating where the seed layer is used as a seed. The copper film 14 is formed to fill the inner region of the seed layer therewith inside the openings 6a and 16a and the through-hole 4. The copper film 14 is also formed on the seed layer (on the diffusion preventing film 7) outside the openings 6a and 16a and the through-hole 4. FIG. 2I shows this state.

Thereafter, a part of the copper film 14, a part of the seed layer, and a part of the diffusion preventing film 7 that lie outside the openings 6a and 16a and the through-hole 4 are removed by, for example, CMP (Chemical Mechanical Polishing). As a result, the exposed surface (CMP surface) of the copper film 14 is formed into the rear-side connection surface 10a that is substantially flush with the surface of the rear-surface protecting film 16. The remaining part of the copper film 14 serves as the penetration electrode 10. Thereafter, the wafer W is cut at predetermined positions so as to produce semiconductor chips 1, one of which is shown in FIG. 1.

At the step of grinding the rear surface Wr of the wafer W (see FIG. 2D) and the step of removing the grinding damage layer (see FIG. 2E) according to the manufacturing method for the semiconductor chip 1 described above, the dummy plug 8 made of non-metallic material, such as a polymer, is disposed in the front-surface-side concave portion 9 (the through-hole 4), but metallic material, such as copper, is not disposed therein. Therefore, since metal atoms are never diffused into the wafer W from the rear surface Wr thereof at these steps, a semiconductor chip 1 that has a semiconductor substrate 2 with less metal contamination can be obtained. In other words, according to this manufacturing method, a semiconductor chip 1 that has less metal contamination and that exhibits excellent properties can be produced while having a penetration electrode 10.

Additionally, since there is no fear that metal contamination will affect the functional device 3, the wafer W can be extremely thinned (for example, less than 50 µm in thickness).

Still additionally, since the wiring member 11 is formed in such a way as to cover the exposed surface of the dummy plug 8 on the side of the front surface of the wafer W, the penetration electrode 10 electrically connected to the wiring member 11 can be formed by filling the inside of the through-hole 4, from which the dummy plug has been removed, with metallic material. Since the wiring member 11 is electrically connected to the functional device 3, the penetration electrode 10 electrically connected to the functional device 3 can be easily produced according to this method.

Figure 3:
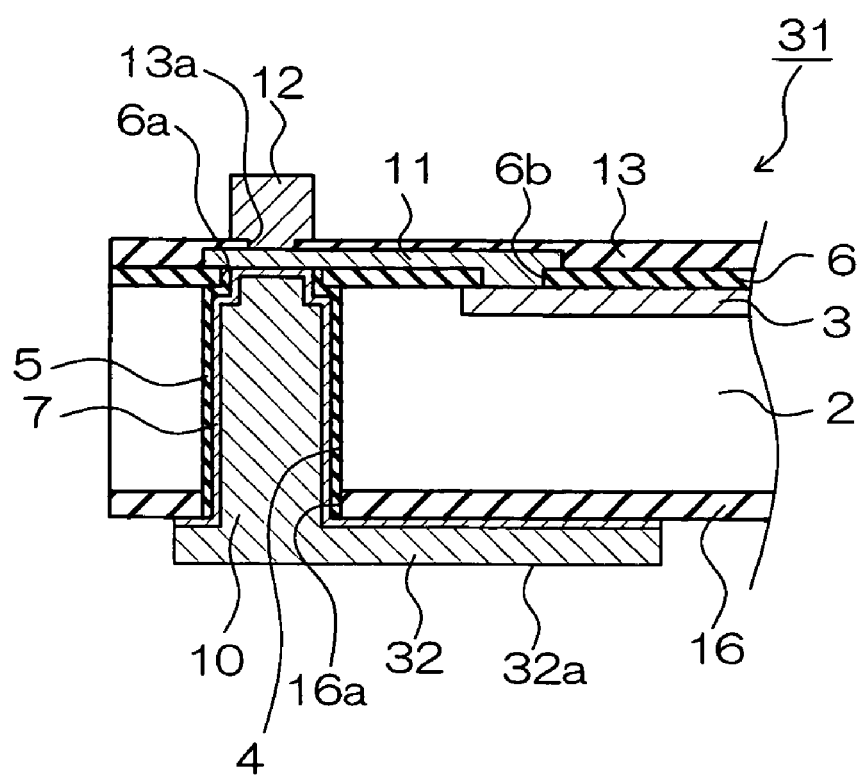
FIG. 3 is a diagrammatic sectional view showing a structure of a semiconductor chip produced by a manufacturing method according to a second embodiment of the present invention.

FIG. 3 is a diagrammatic sectional view showing a structure of a semiconductor chip produced by a manufacturing method according to a second embodiment of the present invention. In FIG. 3, the same reference symbol as in FIG. 1 is given to an element corresponding to each element of FIG. 1, and a description thereof is omitted.

This semiconductor chip 31 has a connection pattern 32 provided in a region around the through-hole 4 on the side of the rear surface of the semiconductor substrate 2. The connection pattern 32 is formed integrally with the penetration electrode 10, and is made of the same kind of material as the penetration electrode 10, i.e., is made of copper. A diffusion preventing film 7 is interposed between the connection pattern 32 and the rear-surface protecting film 16.

The surface of the connection pattern 32 serves as a rear-side connection surface 32a to obtain an electrical connection with the outside of the semiconductor chip 31. A bump of another semiconductor chip or an electrode pad formed on a wiring substrate can be joined at an arbitrary position of the rear-side connection surface 32a. For example, in a semiconductor device that has this semiconductor chip 31 and the wiring substrate, the rear-side connection surface 32a and the electrode pad of the wiring substrate can be connected together by means of a bonding wire.

In the method for manufacturing the semiconductor chip 1, the connection pattern 32 can be obtained such that the copper film 14 is first formed (see FIG. 2I), and the copper film 14, the seed layer, and the diffusion preventing film 7 are partially removed, but an etching operation, for example, through the resist film is carried out so as to leave a predetermined part around the through-hole 4 without completely removing the copper film 14, the seed layer, and the diffusion preventing film 7 existing outside the openings 6a and 16a and the through-hole 4.

Figure 4:
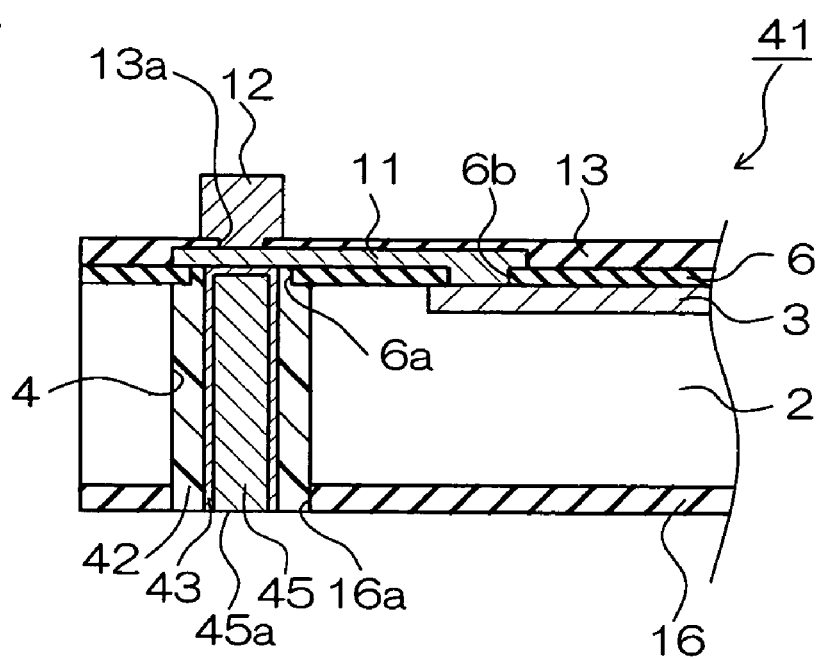
FIG. 4 is a diagrammatic sectional view showing a structure of a semiconductor chip produced by a manufacturing method according to a third embodiment of the present invention.

FIG. 4 is a diagrammatic sectional view showing a structure of a semiconductor chip produced by a manufacturing method according to a third embodiment of the present invention. In FIG. 4, the same reference symbol as in FIG. 1 is given to an element corresponding to each element of FIG. 1, and a description thereof is omitted.

An insulating film 42 made of photosensitive resin, a diffusion preventing film 43, and a penetration electrode 45 made of copper are provided inside the through-hole 4 and the opening 6a of the semiconductor chip 41. The insulating film 42 is provided on the whole surface of the inner wall of the through-hole 4 and the opening 6a. The penetration electrode 45 is disposed along the center axis of the through-hole 4 in an inner region of the insulating film 42. The diffusion preventing film 43 is interposed between the insulating film 42 and the penetration electrode 45 and between the wiring member 11 and the penetration electrode 45.

The insulating film 42 is thicker than the insulating film 5 of the semiconductor chip 1 of FIG. 1. The penetration electrode 45 and the semiconductor substrate 2 are excellently insulated from each other with the insulating film 42. Since the diffusion preventing film 43 is interposed between the penetration electrode 45 and the semiconductor substrate 2, copper atoms constituting the penetration electrode 45 are prevented from being diffused into the semiconductor substrate 2, so as not to deteriorate the properties of the semiconductor chip 41.

On the side of the rear surface of the semiconductor substrate 2, the penetration electrode 45, the diffusion preventing film 43, and the insulating film 42 have each an exposed end face substantially flush with the surface of the rear-surface protecting film 16. The exposed end face of the penetration electrode 45 serves as a rear-side connection surface 45a to make an electrical connection with another semiconductor chip or with a wiring substrate.

FIG. 5A to FIG. 5J are diagrammatic sectional views for explaining the manufacturing method of the semiconductor chip 41 of FIG. 4. In FIGS. 5A to 5J, the same reference symbol as in FIGS. 2A to 2I is given to an element corresponding to each element of FIGS. 2A to 2I, and a description thereof is omitted.

The process ranging from the first step to the step of forming the front-surface-side concave portion 9 by reactive ion etching is performed in the same way as the manufacturing method of the semiconductor chip 1. Subsequent to the concave-portion forming step, the inside of the front-surface-side concave portion 9 and the inside of the opening 6a are filled with photosensitive resin without forming the insulating film 5 (see FIG. 2A), and a dummy plug 48 made of this photosensitive resin is formed (see FIG. 5A).

The photosensitive resin forming the dummy plug 48 has the so-called positive photosensitive properties of being insoluble in a predetermined solvent and becoming soluble in this predetermined solvent by being irradiated with light. The surface exposed from the opening 6a of the dummy plug 48 is made substantially flush with the surface of the hard mask 6.

Thereafter, a resist film 46 (shown in FIG. 5B by the alternate long and two short dashes line) that has an opening 46a at a predetermined position is formed on the side of the front surface of the wafer W. Accordingly, in the exposed surface of the dummy plug 48, the outer peripheral region thereof is covered with the resist film 46, and the inner region thereof is exposed at the inside of the opening 46a.

Figure 5A:
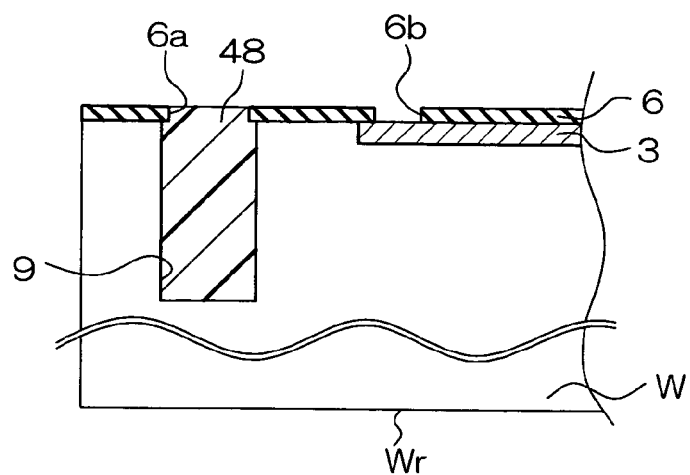
FIG. 5A to FIG. 5J are diagrammatic sectional views for explaining the manufacturing method of a semiconductor device shown in FIG. 4.
Figure 5B:
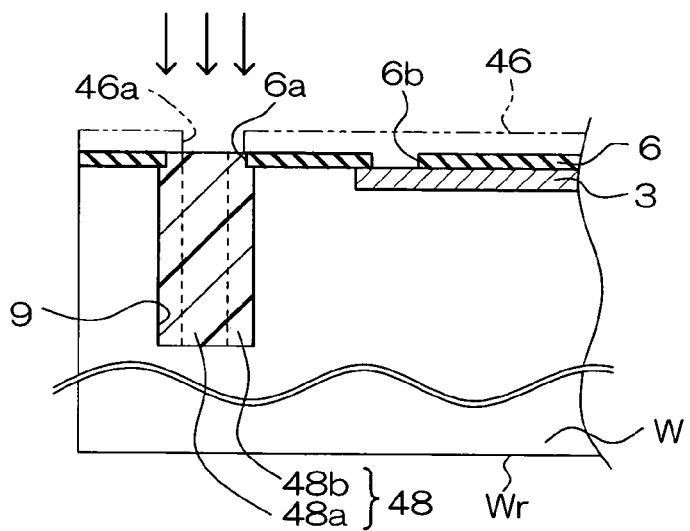

An inner central part 48a of the dummy plug 48 along the center axis of the through-hole 4 is exposed to light through the opening 46a of the resist film 46 and becomes soluble in a predetermined solvent, whereas the outer peripheral part 48b that has not been exposed to light remains insoluble in this solvent (see FIG. 5B).

Figure 5C:
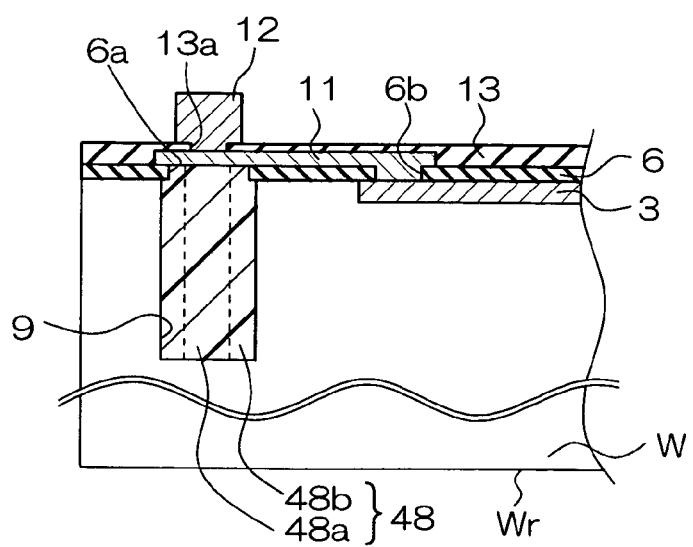

Thereafter, the step of forming the wiring member 11, the front-surface protecting film 13, and the bump 12 is carried out in the same way as the manufacturing method of the semiconductor chip 1. In the exposed central part 48a of the dummy plug 48, apart appearing at the opening 6a of the hard mask 6 comes into contact with the wiring member 11. FIG. 5C shows this state.

Figure 5D:
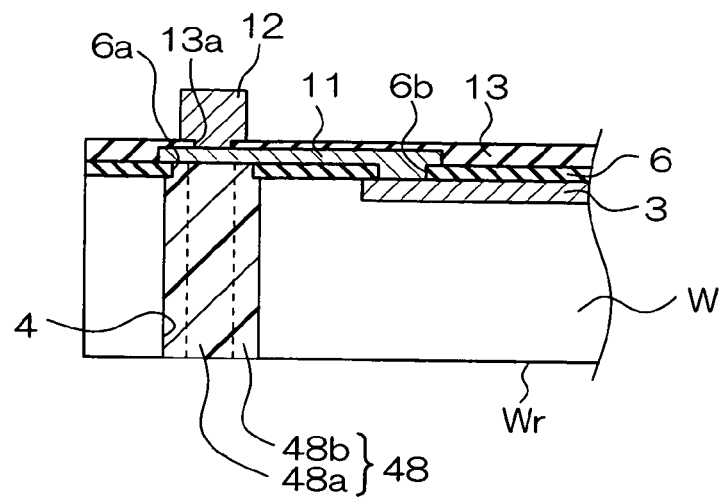

Thereafter, the front surface of the wafer W is stuck onto a supporter not shown, and the rear surface Wr of the wafer W is mechanically ground, whereby the wafer W is thinned. As a result, the dummy plug 48 is exposed at the rear surface Wr of the wafer W, and the front-surface-side concave portion 9 is formed into the through-hole 4 that penetrates the wafer W in the thickness direction. FIG. 5D shows this state.

Figure 5E:
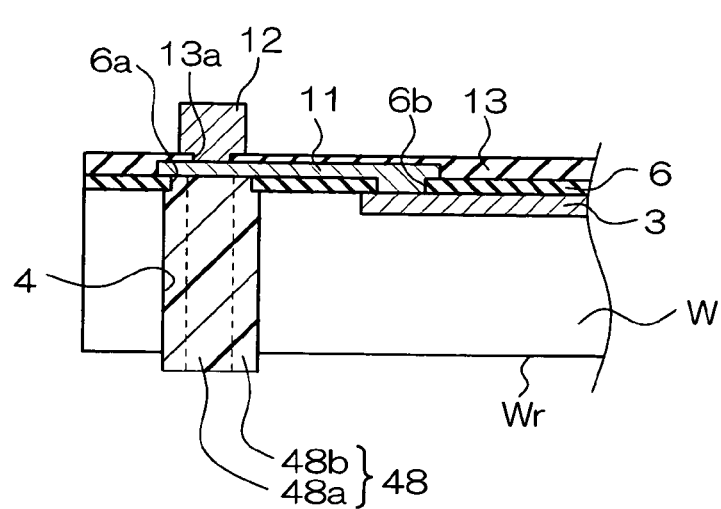

Thereafter, to remove the grinding damage layer of the rear surface Wr of the wafer W, the rear surface Wr of the wafer W is subjected to dry etching or wet etching by approximately 5 μm. At this time, the dummy plug 48 is hardly etched, and juts from the rear surface Wr of the wafer W. FIG. 5E shows this state.

Figure 5F:
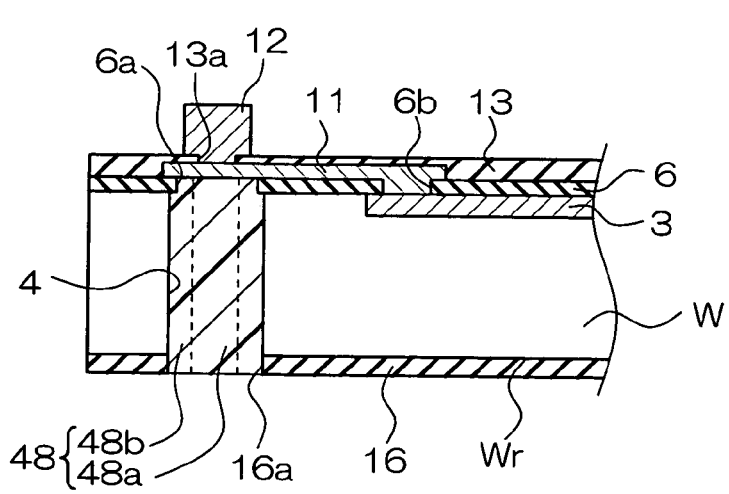

Thereafter, the step of forming the rear-surface protecting film 16 is carried out in the same way as the manufacturing method of the semiconductor chip 1. An opening 16a that has an inner wall surface contiguous to the inner wall surface of the through-hole 4 is formed in the rear-surface protecting film 16. FIG. 5F shows this state.

Figure 5G:
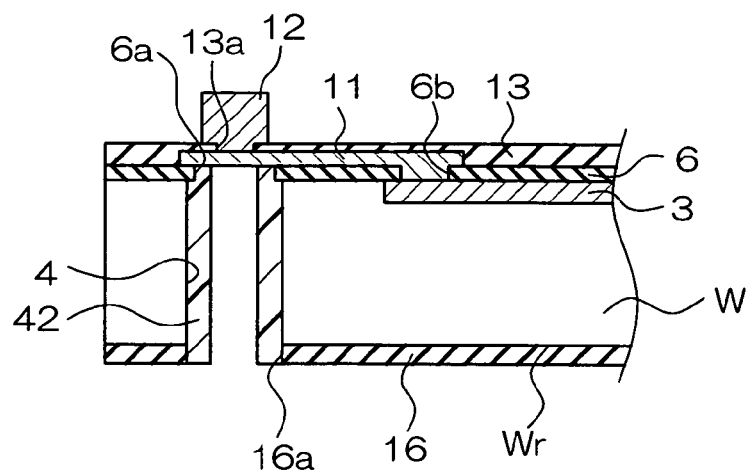

Thereafter, the exposed central part 48a of the dummy plug 48 inside the through-hole 4 and the openings 6a and 16a is removed by an etching operation where the predetermined solvent mentioned above is used. As a result, the wiring member 11 is exposed at the bottom (on the side of the bump 12) of the opening 6a. The remaining part (i.e., the outer peripheral part 48b) of the dummy plug 48 is formed into the insulating film 42. FIG. 5G shows this state.

Figure 5H:
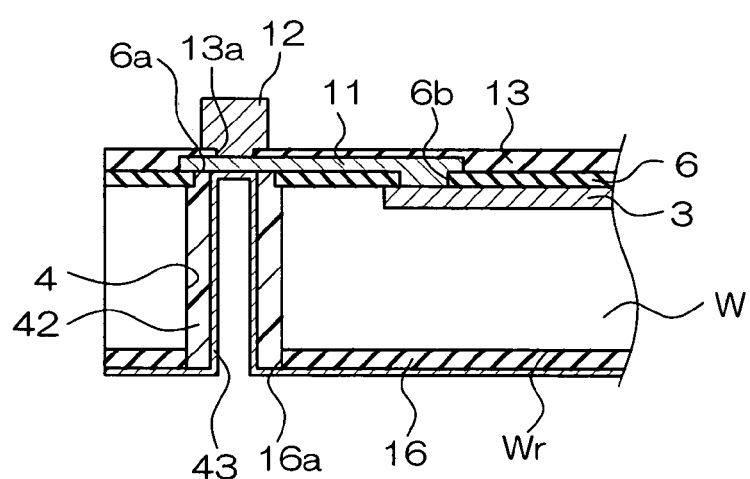

Thereafter, the diffusion preventing film 43 is formed on the whole of the exposed surface on the side of the rear surface Wr of the wafer W that has undergone the foregoing process, i.e., on the exposed surface of the rear-surface protecting film 16, on the exposed surface of the insulating film 42, and on the surface of the wiring member 11 exposed from the opening 6a. FIG. 5H shows this state.

Figure 5I:
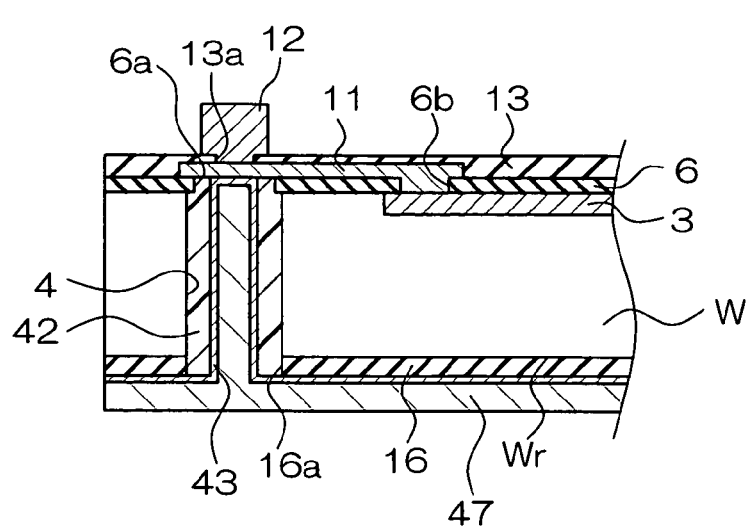

A seed layer (not shown) made of copper is formed on the diffusion preventing film 43. Thereafter, the copper film 47 is formed thereon by electrolytic plating using this seed layer as a seed. The copper film 14 is formed in such a way as to fill the inner region surrounded by the seed layer therewith inside the openings 6a and 16a and the through-hole 4. The copper film 47 is also formed on the seed layer (the diffusion preventing film 43) outside the openings 6a and 16a and the through-hole 4. FIG. 5I shows this state.

Thereafter, a part of the copper film 47, a part of the seed layer, and a part of the diffusion preventing film 43 that exist outside the openings 6a and 16a and the through-hole 4 are removed by, for example, etchback. As a result, the exposed surface (the etchback surface) of the copper film 47 serves as the rear-side connection surface 45a that is substantially flush with the surface of the rear-surface protecting film 16. The remaining part of the copper film 47 serves as the penetration electrode 45. Thereafter, the wafer W is cut at predetermined positions into semiconductor chips 41, one of which is shown in FIG. 4.

Likewise, in the manufacturing method of the semiconductor chip 41, the dummy plug 48 made of photosensitive resin is provided in the front-surface-side concave portion 9 (the through-hole 4), and metallic material, such as copper, is not provided therein at the step of grinding the rear surface Wr of the wafer W (see FIG. 5D) and the step of removing the grinding damage layer (see FIG. 5E) Therefore, since metal atoms are never diffused into the wafer W at these steps, the semiconductor chip 41 having the semiconductor substrate 2 that has undergone less metal contamination can be obtained.

A thick insulating film 42 can be formed by thickening the outer peripheral part 48b not exposed to light at the step of exposing the dummy plug 48 to light (see FIG. 5B). The thickness of the outer peripheral part 48b not exposed to light can be easily controlled by the size of the opening 46a (see FIG. 5B) of the resist film 46. If the insulating film 5 is formed according to the CVD method in the same way as the manufacturing method of the semiconductor chip 1, the insulating film 5 may not be formed so thick as to completely cover the inner wall surface of the through-hole 4 and the inner wall surface of the opening 6a therewith, and hence an insulation failure will be caused. In contrast, in the manufacturing method of the semiconductor chip 41, the insulating film 42 thicker than the insulating film 5 according to the CVD method can be easily formed, thus making it possible to form the insulating film 42 by which electrical insulation is reliably established between the penetration electrode 45 and the semiconductor substrate 2.

Figure 5J:
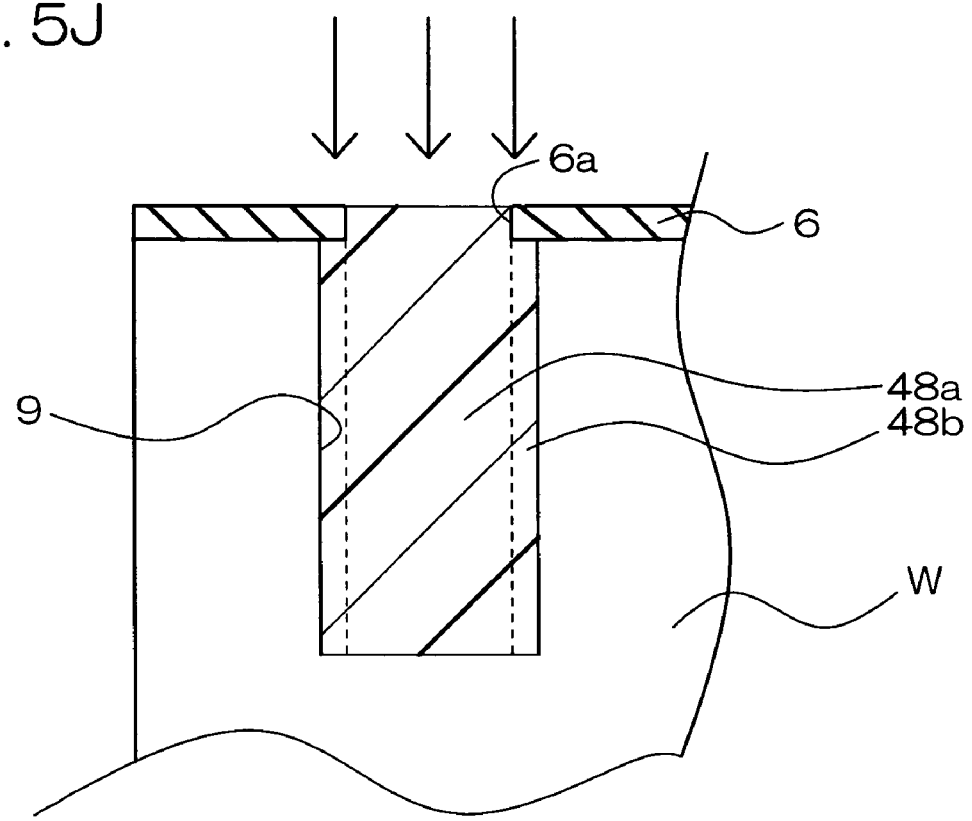

The step of exposing the dummy plug 48 to light is carried out by separately forming the resist film 46 as shown in FIG. 5B. Instead, as shown in FIG. 5J, this exposure step may be carried out such that a projection of the hard mask 6 near the opening 6a formed in accordance with the formation of the front-surface-side concave portion 9 under reactive ion etching is used as a mask. As above, at this exposure step, the outer peripheral part 48b that has a width corresponding to a length projected from the edge of the front-surface-side concave portion 9 of the hard mask 6 inward is not exposed to light and remains insoluble in a predetermined solvent, whereas the inner central part 48a is exposed to light and becomes soluble in the predetermined solvent.

Figure 6:
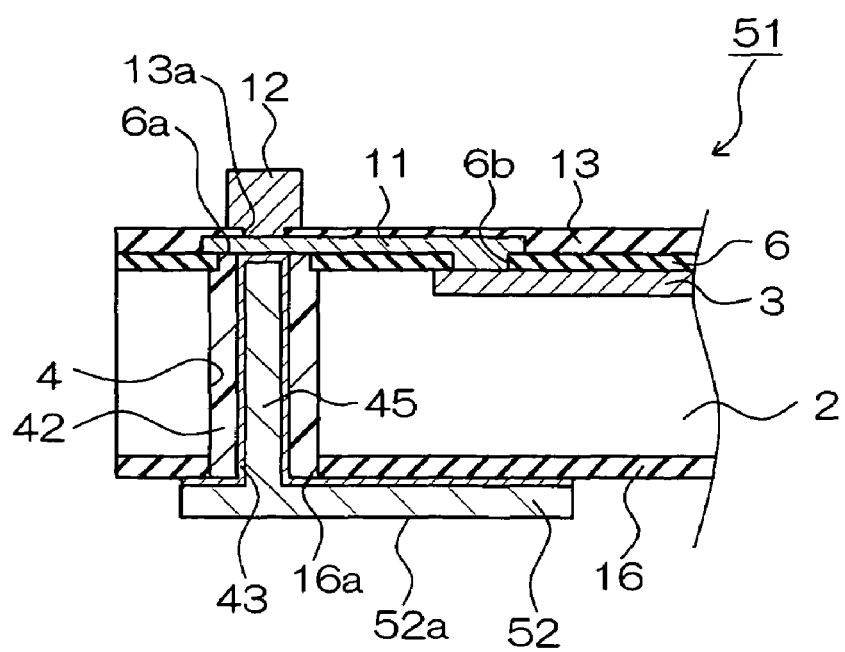
FIG. 6 is a diagrammatic sectional view showing a structure of a semiconductor chip produced by a manufacturing method according to a fourth embodiment of the present invention.

FIG. 6 is a diagrammatic sectional view showing a structure of a semiconductor chip produced by a manufacturing method according to a fourth embodiment of the present invention. In FIG. 6, the same reference symbol as in FIG. 4 is given to an element corresponding to each element of FIG. 4, and a description thereof is omitted.

This semiconductor chip 51 has a connection pattern 52 provided in a region around the through-hole 4 on the side of the rear surface of the semiconductor substrate 2. The connection pattern 52 is formed integrally with the penetration electrode 45 and is made of the same kind of material as the penetration electrode 45, i.e., is made of copper. The diffusion preventing film 43 is interposed between the connection pattern 52 and the rear-surface protecting film 16.

The surface of the connection pattern 52 serves as a rear-side connection surface 52a to obtain an electrical connection with the outside of the semiconductor chip 51. A bump of another semiconductor chip, an electrode pad formed on a wiring substrate, a bonding wire, etc., can be joined at arbitrary positions of the rear-side connection surface 52a.

In the manufacturing method of the semiconductor chip 51, the rear-side connection surface 52a can be obtained such that the copper film 47 is first formed (see FIG. 5I), and then the copper film 47, the seed layer, and the diffusion preventing film 43 are partially removed, but an etching operation, for example, through the resist film is carried out so as to leave a predetermined part around the through-hole 4 without completely removing the copper film 47, the seed layer, and the diffusion preventing film 43 existing outside the openings 6a and 16a and the through-hole 4.

Figure 7:
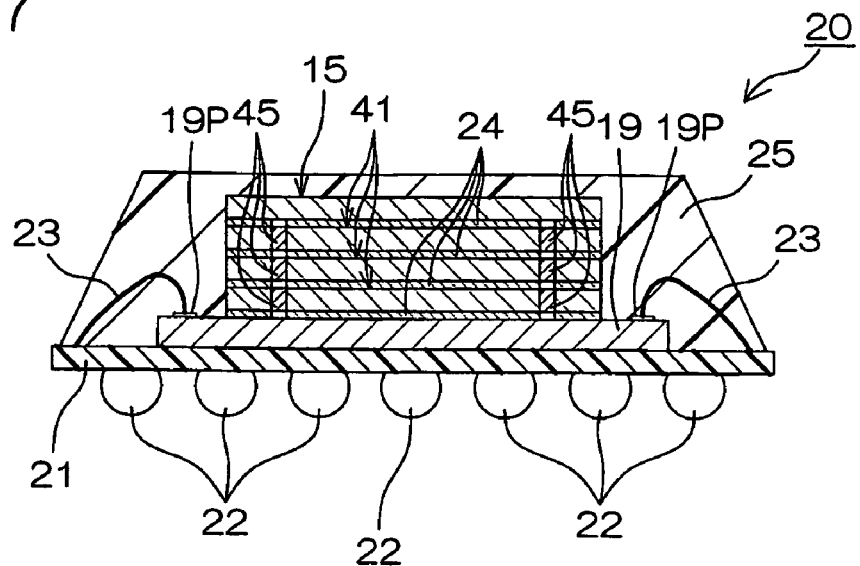
FIG. 7 is a diagrammatic sectional view showing a structure of a semiconductor device that includes a plurality of semiconductor chips, one of which is shown in FIG. 4.

FIG. 7 is a diagrammatic sectional view showing a structure of a semiconductor device provided with a plurality of semiconductor chips 41, one of which is shown in FIG. 4. In FIG. 7, the same reference symbol as in FIG. 4 is given to an element corresponding to each element of FIG. 4, and a description thereof is omitted.

This semiconductor device 20 having a BGA (Ball Grid Array) package and a multichip stack structure includes a flat wiring substrate (interposer) 21. A flat solid state device 19, such as a semiconductor chip or a wiring substrate, is stacked on the wiring substrate 21. A plurality of semiconductor chips (three semiconductor chips in this embodiment) 41, one of which is shown in FIG. 4, are stacked on the solid state device 19. A semiconductor chip 15 is stacked on the semiconductor chips 41. Except that the semiconductor chip 15 does not have the through-hole 4 (the penetration electrode 45), the semiconductor chip 15 has the same structure and the same size as the semiconductor chip 41.

The wiring substrate 21 is made of insulating material and has wires (not shown) provided on its surface or in its inside. Both of the semiconductor chips 41 and 15 are bonded according to a so-called face down method in which the surface (the surface on which the functional device 3 is formed) is directed to the solid state device 19.

The bump 12 of one of the semiconductor chips 41 and 15 is bonded to the rear-side connection surface 45a (see FIG. 4) of the other semiconductor chip 41 between the two adjoining semiconductor chips 41 or between the semiconductor chip 41 and the semiconductor chip 15. A gap is formed between the semiconductor chips 41 and 15 and between the semiconductor chip 41 and the solid state device 19. This gap is sealed up with layer-to-layer sealing material 24 made of resin.

A metallic ball (e.g., solder ball) 22 is bonded onto the other surface (the surface opposite the side of the solid state device 19) of the wiring substrate 21.

The solid state device 19 is smaller than the wiring substrate 21 and is bonded to the substantially central part of the wiring substrate 21 when viewed perpendicularly to the wiring substrate 21 and to the solid state device 19. The semiconductor chips 41 and 15 are smaller than the solid state device 19 and are bonded to the substantially central part of the solid state device 19 when the solid state device 19 and the semiconductor chips 41 and 15 are viewed vertically like a plan view. The semiconductor chips 41 and 15 are substantially equal to each other in size and shape when viewed from the direction perpendicular to these, and are disposed so as to lie almost exactly on each other.

An electrode pad (not shown) is provided in a region to which the solid state device 19 is not opposed on the peripheral part of the one surface of the wiring substrate 21. This electrode pad is re-wired inside the wiring substrate 21 or on the wiring substrate 21, and is electrically connected to metallic balls 22 provided on the other surface of the wiring substrate 21.

An external-connection pad 19P is formed in a region to which the semiconductor chip 41 is not opposed on the outer peripheral part of the one surface (i.e., the surface opposite the wiring substrate 21) of the solid state device 19. The electrode pad of the wiring substrate 21 and the external-connection pad 19P of the solid state device 19 are electrically connected to each other through the bonding wire 23.

The semiconductor chips 41 and 15, the solid state device 19, the bonding wire 23, and the surface of the wiring substrate 21 on the side of the solid state device 19 are sealed with sealing resin (molding resin) 25.

The functional device 3 of each of the semiconductor chips 41 and 15 is connected to the solid state device 19 through the penetration electrode 45 with a short distance therebetween. The semiconductor device 20 can be mounted on another wiring substrate through the metallic balls 22.

Figure 8:
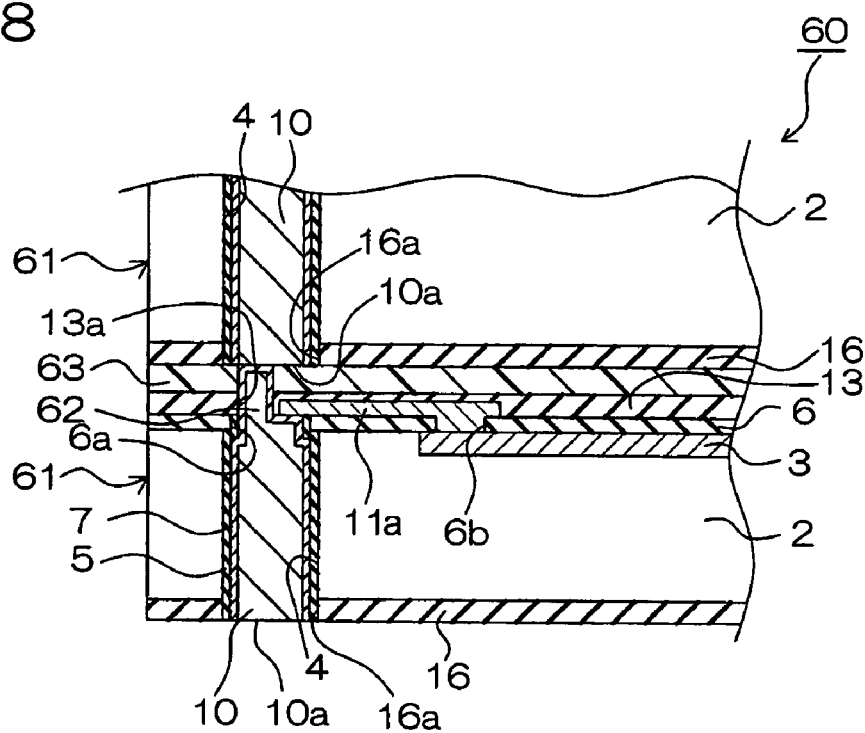
FIG. 8 is a diagrammatic sectional view showing a structure of a semiconductor device according to one embodiment of the present invention.

FIG. 8 is a diagrammatic sectional view showing a structure of a semiconductor device according to one embodiment of the present invention. In FIG. 8, the same reference symbol as in FIG. 1 is given to an element corresponding to each element of FIG. 1, and a description thereof is omitted.

This semiconductor device 60 includes a plurality of semiconductor chips 61 stacked together, and has a BGA package, for example, similar to that of the semiconductor device 20 of FIG. 7. FIG. 8 shows only two adjoining semiconductor chips 61.

The semiconductor chip 61 has a bump 62 that penetrates the front-surface protecting film 13 and that is formed integrally with the penetration electrode 10, instead of the bump 12 of the semiconductor chip 1 of FIG. 1. That is, the bump 62 is made of the same material (copper) as the penetration electrode 10.

The width of the bump 62 is smaller than that of the opening 6a of the hard mask 6. An end on the front-surface side of the penetration electrode 10 has a flat surface substantially flush with the surface of the hard mask 6. A wiring member 11A is bonded to this flat surface of the penetration electrode 10. The wiring member 11A is electrically connected to the functional device 3 through the contact hole 6b of the hard mask 6.

If the end of the penetration electrode 10 does not have such a flat surface and if the width of the bump 62 is almost equal to that of the opening 6a, the wiring member 11A will come into contact with the side face of the bump 62, and the contact area between the wiring member 11A and the bump 62 will become small, thus lowering the connection reliability. On the other hand, if the wiring member 11A is bonded to the flat surface of the end of the penetration electrode 10 as in the semiconductor device 60 of FIG. 8, the contact area between the penetration electrode 10 and the wiring member 11A will become large, and electrical connection reliability will be increased.

The diffusion preventing film 7 is formed on the surface (periphery) of the penetration electrode 10 (excluding the rear-side connection surface 10a) and the bump 62. The diffusion preventing film 7 is not interposed between the penetration electrode 10 and the bump 62.

The bump 62 juts from the surface of the front-surface protecting film 13. The rear-side connection surface 10a of one semiconductor chip 61 is bonded to the bump 61 of another semiconductor chip 61. A gap having a size that is almost equal to the height of the projection of the bump 62 from the front-surface protecting film 13 is formed between the front surface of one semiconductor chip 61 and the rear surface of another semiconductor chip 61. This gap is filled with an adhesive layer 63 made of resin. The two semiconductor chips 61 are bonded together with the adhesive layer 63. The adhesive layer 63 is made of, for example, epoxy or acrylic.

FIG. 9A to FIG. 9H are diagrammatic sectional views for explaining the manufacturing method of the semiconductor device 60 of FIG. 8. In FIGS. 9A to 9H, the same reference symbol as in FIGS. 2A to 2I is given to an element corresponding to each element of FIGS. 2A to 2I, and a description thereof is omitted.

A plurality of wafers W1 and W2 having a plurality of regions corresponding to the semiconductor chips 61 are used in the manufacturing method of the semiconductor device 60.

First, the process ranging from the first step to the step of forming the dummy plug 8 with respect to the wafer W1 is carried out in the same way as the manufacturing method of the semiconductor chip 1 of FIG. 1 (see FIG. 2B). Thereafter, a wiring member 11A electrically connected to the functional device 3 is formed in the same way as the wiring member 11 in the manufacturing method of the semiconductor chip 1. It should be noted that the wiring member 11A is formed in such a manner as to cover a part (e.g., approximately one-third) of the exposed surface of the dummy plug 8 exposed from the opening 6a of the hard mask 6.

Figure 9A:
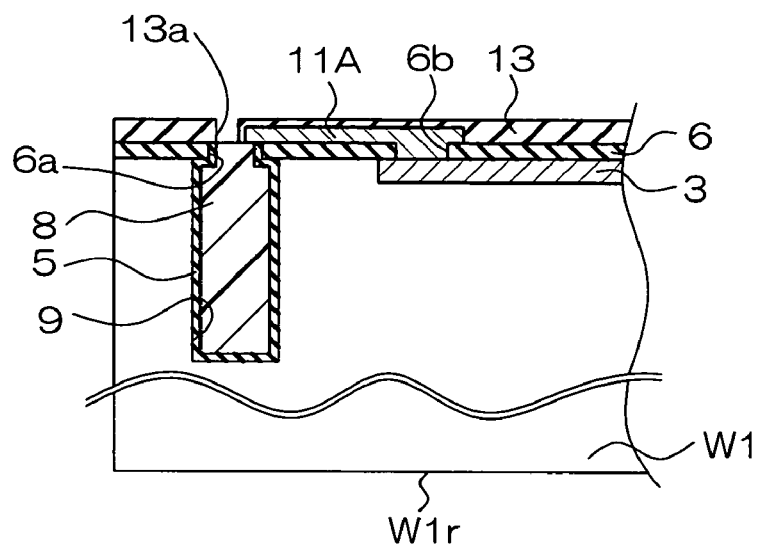
FIG. 9A to FIG. 9H are diagrammatic sectional views for explaining the manufacturing method of the semiconductor device shown in FIG. 8.

Thereafter, the front-surface protecting film 13 is formed on the whole surface on the front-surface side of the wafer W1 that has undergone the foregoing steps, and the opening 13a is formed in a predetermined region of the front-surface protecting film 13. The opening 13a is formed such that a part not being in contact with the wiring member 11A is exposed in the dummy plug 8. FIG. 9A shows this state.

Figure 9B:
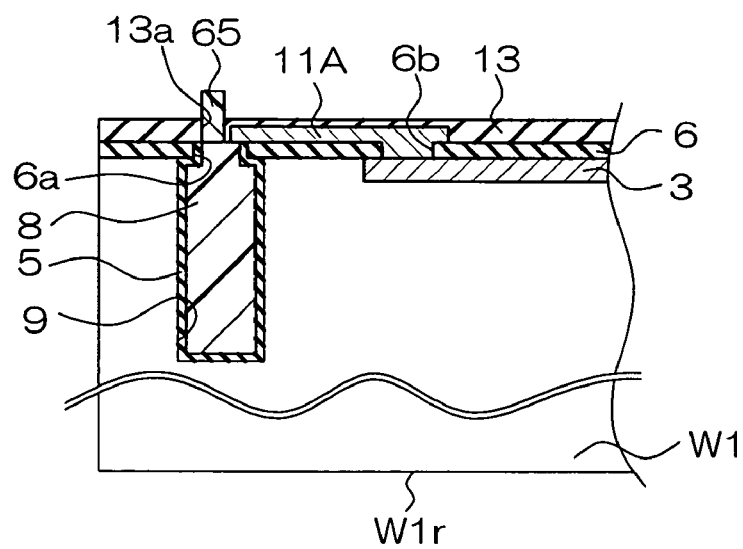

Thereafter, a dummy bump 65 that comes into contact with the dummy plug 8 through the opening 13a is formed (see FIG. 9B). The dummy bump 65 is almost equal in size and shape to the bump 62 of the semiconductor chip 61 (see FIG. 8), and juts from the surface of the front-surface protecting film 13. The dummy bump 65 is made of material that can be easily removed by an etching operation using a suitable solvent. For example, the dummy bump 65 is made of the same material as the dummy plug 8. However, the material of the dummy bump 65 may be different from that of the dummy plug 8.

Thereafter, a wafer W2 in which regions that correspond to the finished semiconductor chips 61 (see FIG. 8) are tightly formed is prepared. The rear surface W2r of the wafer W2 is then caused to face the front surface of the wafer W1, and the dummy bump 65 of the wafer W1 is brought into contact with the rear-side connection surface 10a of the wafer W2. The position of the wafer W1 with respect to the wafer W2 is adjusted, for example, by passing a beam of infrared light through the wafer W1 from the rear surface W1r of the wafer W1 and monitoring the infrared light reflected by the wafer W2 while ascertaining an alignment mark placed on the wafer W2.

This step may be carried out in a state in which the front-surface side of the wafer W2 is stuck onto a supporter. A gap having a size that is almost equal to the height of the projection of the bump 65 from the front-surface protecting film 13 is formed between the wafer W1 and the wafer W2.

Figure 9C:
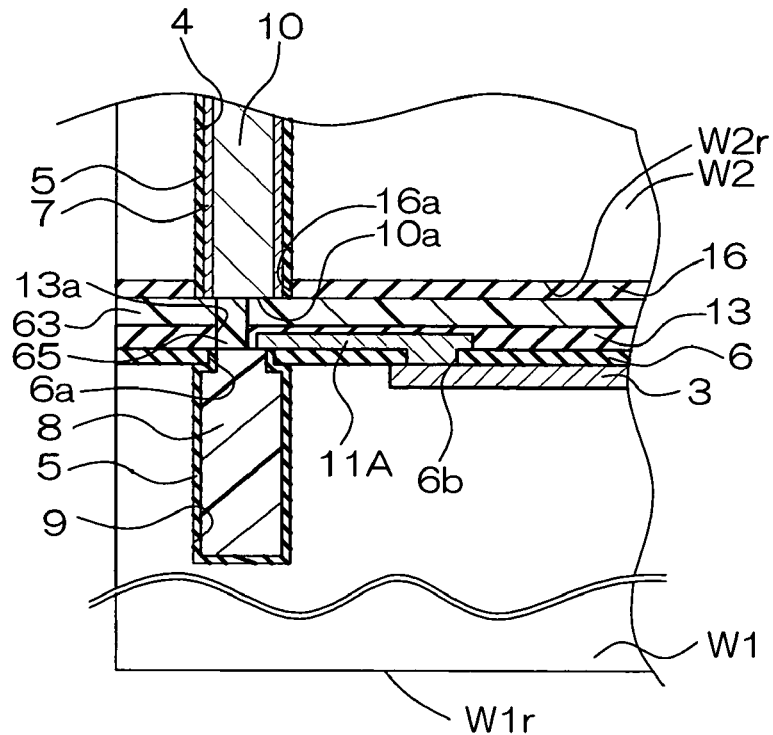

Thereafter, the gap between the wafer W1 and the wafer W2 is filled with an adhesive, thus forming the adhesive layer 63. If epoxy or acrylic is used for the adhesive layer 63, the adhesive layer 63 can be obtained, for example, by pouring unhardened liquid epoxy or acrylic into the gap therebetween and then hardening the epoxy or and acrylic. The adhesive layer 63 is disposed in such a manner as to surround the periphery of the dummy bump 65 and trace the dummy bump 65. FIG. 9C shows this state.

Figure 9D:
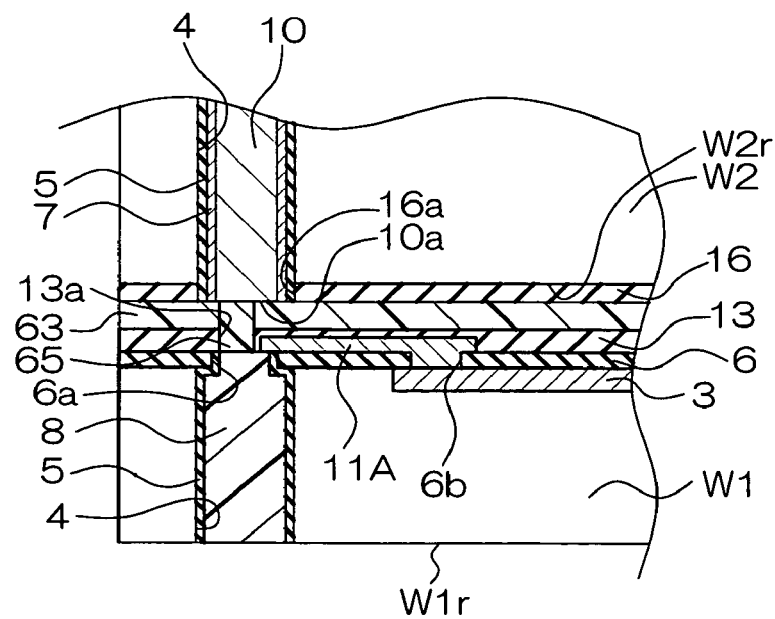

Thereafter, the rear surface W1r of the wafer W1 is mechanically ground, whereafter the dummy plug 8 is exposed at the rear surface W1r of the wafer W1, and the front-surface-side concave portion 9 is formed into the through-hole 4. FIG. 9D shows this state.

Figure 9E:
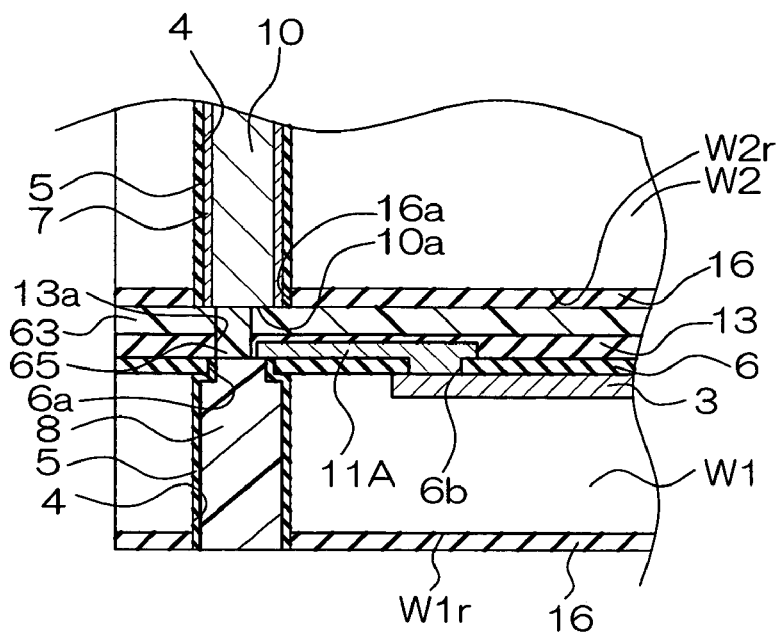

Thereafter, the step of forming the rear-surface protecting film 16 is carried out in the same way as in the manufacturing method of the semiconductor chips 1 and 41. The opening 16a that has an inner wall surface contiguous to the inner wall surface of the through-hole 4 is formed in the rear-surface protecting film 16. FIG. 9E shows this state.

Figure 9F:
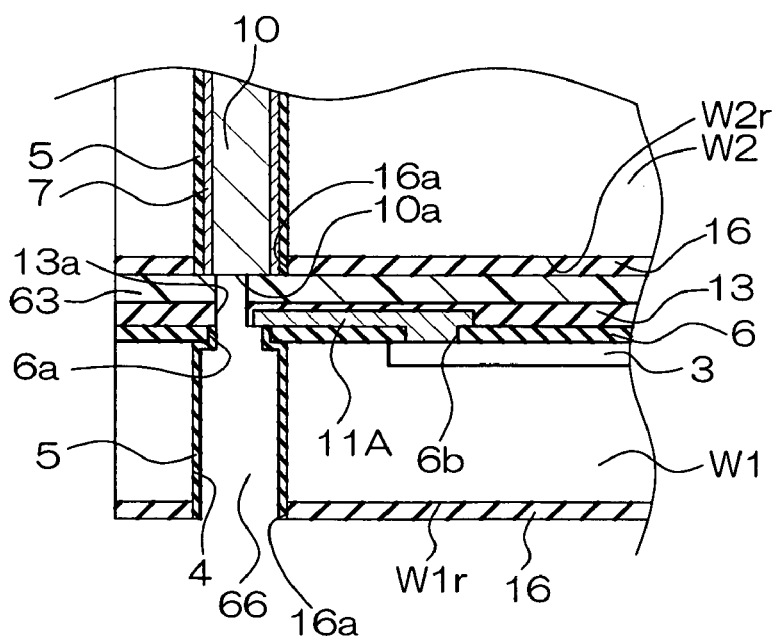

Thereafter, the dummy plug 8 and the dummy bump 65 are removed by an etching operation using a suitable solvent. As a result, an empty area 66 in which the internal space of the opening 16a, the through-hole 4, and the opening 6a communicates with the space defined by the adhesive layer 63 is formed. From the fact that the wiring member 11A is formed to be in contact with the dummy plug 8 and from the fact that the dummy bump 65 is in contact with the rear-side connection surface 10a of the wafer W2, the wiring member 11A and the rear-side connection surface 10a of the wafer W2 are exposed in the empty area 66 from which the dummy plug 8 and the dummy bump 65 have been removed. FIG. 9F shows this state.

Figure 9G:
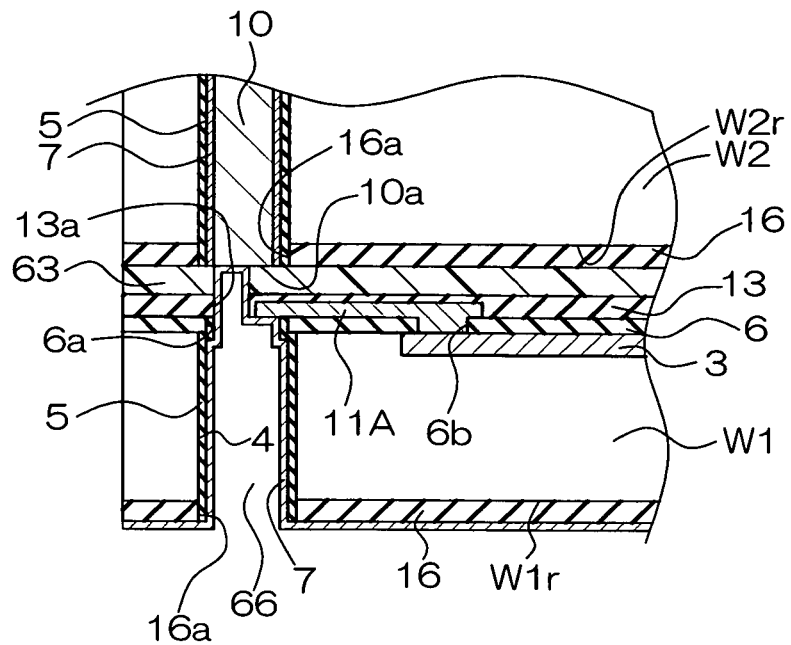

Thereafter, the diffusion preventing film 7 is formed on the whole exposed surface on the side of the rear surface W1r of the wafer W1 that has undergone the foregoing steps, i.e., the surface of the rear-surface protecting film 16 and the inner wall surface of the empty area 66 (which includes the rear-side connection surface 10a of the wafer W2 and the exposed surface of the wiring member 11A) FIG. 9G shows this state.

Figure 9H:
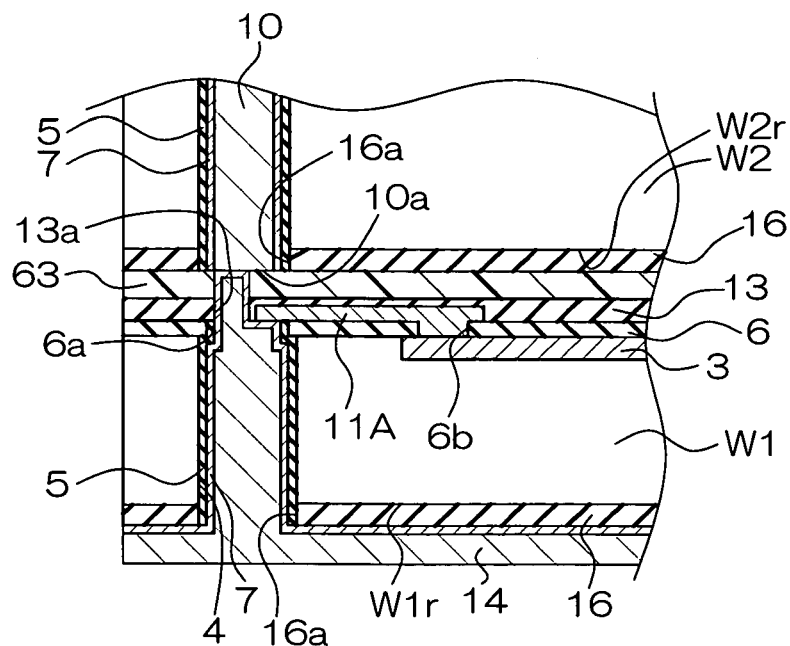

A seed layer (not shown) made of copper is then formed on the diffusion preventing film 7, and the copper film 14 is formed thereon by electrolytic plating using this seed layer as a seed. The copper film 14 is formed in such a manner as to fill the inner region surrounded by the seed layer inside the empty area 66 therewith. The copper film 14 is also formed on the seed layer (the diffusion preventing film 7) outside the empty area 66. FIG. 9H shows this state.

Thereafter, a part of the copper film 14, a part of the seed layer, and a part of the diffusion preventing film 7 that exist outside the empty area 66 are removed by, for example, etchback. As a result, the exposed surface (etchback surface) of the copper film 14 is formed into the rear-side connection surface 10a that is substantially flush with the surface of the rear-surface protecting film 16. A part of the copper film 14 remaining in the opening 16a, in the through-hole 4, and in the opening 6a serves as the penetration electrode 10, and a part of the copper film 14 remaining in the opening 13a and in the space divided by the adhesive layer 63 serves as the bump 62 formed integrally with the penetration electrode 10.

Thereafter, the wafers W1 and W2 are cut at predetermined positions so as to produce the semiconductor device 60 having the semiconductor chips 61 stacked together shown in FIG. 8.

In the manufacturing method of the semiconductor device 60, the formation of the bump 62 and the penetration electrode 10, the bonding of the bump 62 with the rear-side connection surface 10a of the wafer W2, and the bonding of the penetration electrode 10 with the wiring member 11A can be simultaneously achieved by supplying metallic material into the empty area 66 penetrating the wafer W1 stacked on the wafer W2.

There is no need to stack the thinned wafer W1 (the semiconductor substrate 2) on the wafer W2 (the other semiconductor substrate 2), because the wafer W1 is thinned while being stacked on the wafer W2.

After forming the penetration electrode 10 of the wafer W1, another wafer having the same structure as the wafer W1 of FIG. 9B may be further placed on the rear surface W1r of the wafer W1 before cutting the wafers W1 and W2, and may be provided with the penetration electrode 10 and the bump 62 in the same way as the wafer W1. Thereafter, the wafers W1 and W2, and the other wafers having the same structure as the wafer W1 are cut, thus making it possible to produce a semiconductor device in which the three semiconductor chips 61 are stacked together and are electrically connected together.

Figure 10:
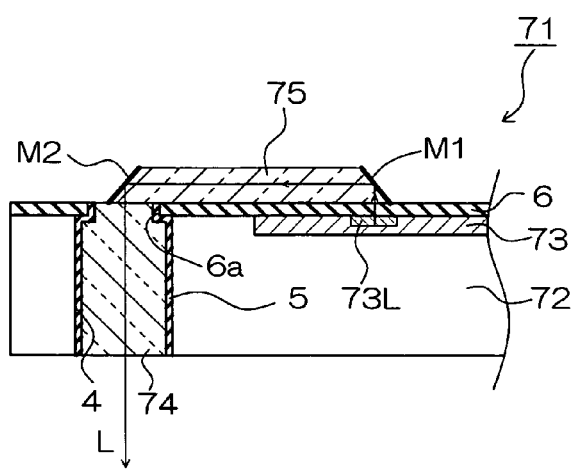
FIG. 10 is a diagrammatic sectional view showing a structure of a semiconductor chip according to one embodiment of the present invention.

FIG. 10 is a diagrammatic sectional view showing a structure of a semiconductor chip according to one embodiment of the present invention. In FIG. 10, the same reference symbol as in FIG. 1 is given to an element corresponding to each element of FIG. 1, and a description thereof is omitted.

This semiconductor chip 71 has a semiconductor substrate 72. The semiconductor substrate 72 has a functional device 73 on its one surface (hereinafter, referred to as "front surface"). The functional device 73 has a light emitting portion 73L. A hard mask 6 made of silicon oxide is formed on the surface of the semiconductor substrate 72 in such a manner as to cover the functional device 73.

A through-hole 4 that penetrates the semiconductor substrate 72 in its thickness direction is formed beside the functional device 73. An opening 6a is formed in the hard mask 6 in a region substantially coinciding with the through-hole 4 when viewed perpendicularly to the surface of the semiconductor substrate 72. An insulating film 5 made of silicon oxide is formed on the inner wall of the through-hole 4 and on the inner wall of the opening 6a. The inside of the through-hole 4 and the inside of the opening 6a are filled with transparent material (e.g., transparent resin), whereby a penetration waveguide 74 is formed. The transparent material can transmit light (including invisible light, such as infrared light, as well as visible light) emitted from the light emitting portion 73L.

A surface waveguide 75 made of transparent material (e.g., transparent resin) is provided on the hard mask 6 from above the light emitting portion 73L to the penetration waveguide 74. The surface waveguide 75 is shaped like a trapezoid in the cross-section shown in FIG. 10, and has slopes, each forming an angle of 45° with the semiconductor substrate 72 on the light emitting portion 73L and on the through-hole 4. Aluminum (Al) is deposited on these slopes, whereby mirrors M1 and M2 are formed.

The mirror M1 assumes a posture capable of reflecting a beam of light emitted from the light emitting portion 73L and guiding the reflected light toward the mirror M2. The mirror M2 assumes a posture capable of guiding a beam of light incident from the mirror M1 toward the rear surface (i.e., the surface opposite the surface on which the functional device 73 is formed) of the semiconductor substrate 72 through the through-hole 4.

Light (a light signal) emitted from the light emitting portion 73L of the functional device 73 is transmitted through the hard mask 6, then proceeds through the surface waveguide 75, is then reflected by the mirror M1, is then reflected by the mirror M2, then proceeds to the penetration waveguide 74 provided in the through-hole 4 from the surface waveguide 75, and arrives at the side of the rear surface of the semiconductor substrate 72 (this light path is shown by arrow L in FIG. 10).

Since this semiconductor chip 71 has the through-hole 4 and the light emitting portion 73L both of which are formed in the single chip, the problem of the mounting accuracy is never caused, unlike a case in which a chip having a light emitting element is mounted on a substrate having a through-hole. In other words, in this semiconductor chip 71, the light signal can be excellently sent through the through-hole 4.

If three or more semiconductor chips each of which has the light emitting portion 73L or a light receiving portion and has no through-hole 4 are stacked together, it was impossible to directly send and receive a light signal between two semiconductor chips that are not adjacent to each other. In contrast, in this semiconductor chip 71, a light signal can be sent through the through-hole 4, and hence it is possible to stack three or more semiconductor chips 71 together and directly send and receive a light signal between two semiconductor chips 71 that are not adjacent to each other.

Figure 11:
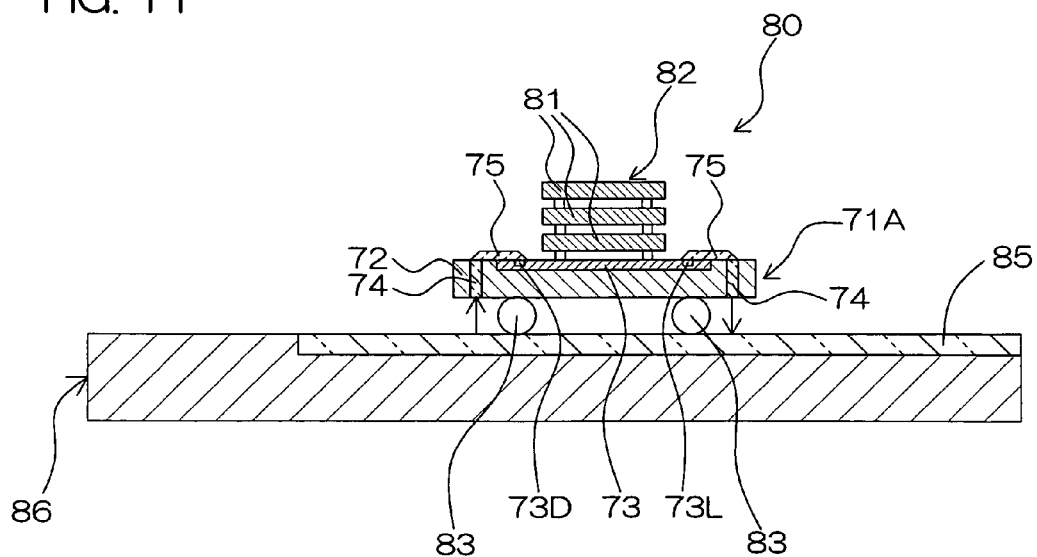
FIG. 11 is a diagrammatic sectional view showing a semiconductor device in which a semiconductor chip having a light emitting portion and a light receiving portion is used as an interposer and showing a structure of a mounting board on which the semiconductor device is mounted.

FIG. 11 is a diagrammatic sectional view showing a semiconductor device in which a semiconductor chip having a light emitting portion 73L and a light receiving portion is used as an interposer and showing a structure of a mounting board on which this semiconductor device is mounted. In FIG. 11, the same reference symbol as in FIG. 10 is given to an element corresponding to each element of FIG. 10, and a description thereof is omitted.

A semiconductor chip 71A of this semiconductor device 80 has the semiconductor substrate 72. The functional device 73 is formed on one surface (a front surface) of the semiconductor substrate 72. A light emitting portion 73L and a light receiving portion 73D are formed in the peripheral portion of the functional device 73. An LSI module 82 formed by stacking a plurality of LSI chips 81 together is bonded onto a region which is the center portion of the functional device 73 and in which the light emitting portion 73L and the light receiving portion 73D are not formed.

Metallic balls 83 used as external-connection material are provided on a surface (a rear surface) of the semiconductor substrate 72 opposite the functional device 73.

The semiconductor device 80 is mounted on a surface of the mounting board 86 having an optical waveguide 85 formed on this surface, with the metallic balls 83 between the semiconductor device 80 and the mounting board 86. The position of the semiconductor device 80 with respect to the mounting board 86 is adjusted so that the penetration waveguide 74 (the through-hole) of the semiconductor chip 71A is positioned above a predetermined part of the optical waveguide 85. Therefore, the light emitting portion 73L and the light receiving portion 73D of the semiconductor chip 71A provided in the semiconductor device 80 can send and receive a light signal to and from the mounting board 86.

The semiconductor chip 71A has the penetration waveguide 74 (through-hole), thereby making it possible to realize the semiconductor device 80 capable of sending and receiving a light signal to and from the mounting board 86 provided on the side of one surface of the semiconductor chip 71A although the light emitting portion 73L, the light receiving portion 73D, and the LSI module 82 are provided on the side of the other surface of the semiconductor chip 71A.

Figure 14:
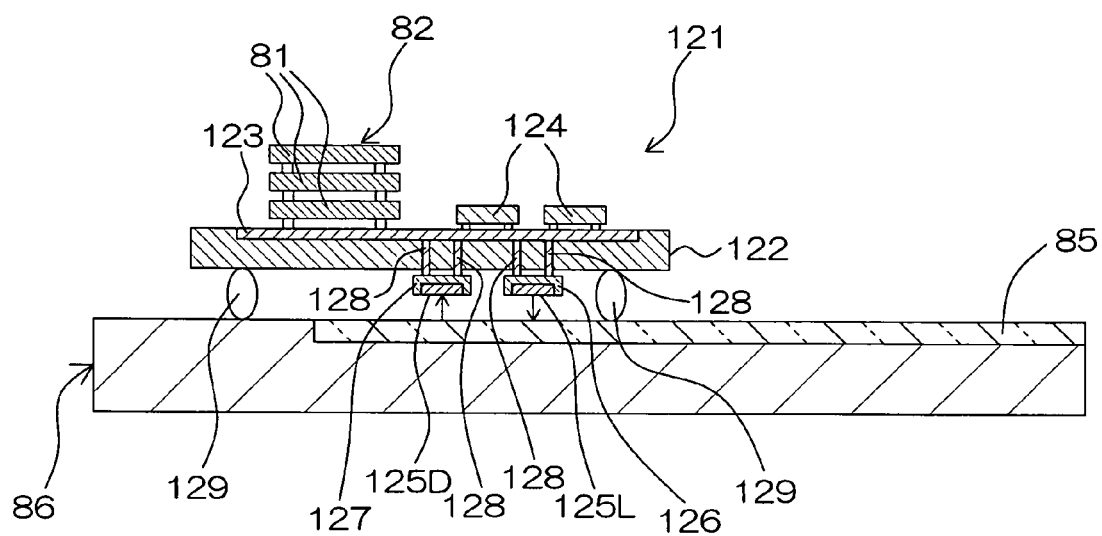
FIG. 14 is a diagrammatic sectional view showing a conventional semiconductor device that sends and receives a light signal and showing a structure of a mounting board on which the semiconductor device is mounted.

FIG. 14 is a diagrammatic sectional view showing a structure of a conventional semiconductor device that sends and receives a light signal and showing a structure of a mounting board on which this semiconductor device is mounted. In FIG. 14, the same reference symbol as in FIG. 11 is given to an element corresponding to each element of FIG. 11, and a description thereof is omitted.

This semiconductor device 121 has a semiconductor chip 122 that has a wire 123 formed on its one surface (front surface) and that is used as an interposer. An LSI module 82 and a plurality of driver IC chips 124 for photoelectrical conversion are arranged sidewise in parallel with the semiconductor chip 122 and are bonded onto the front surface of the semiconductor chip 122. The LSI module 82 and the driver IC chips 124 for photoelectrical conversion are electrically connected together through the wire 123.

A light emitting chip 126 provided with a light emitting element 125L and a light receiving chip 127 provided with a light receiving element 125D are bonded onto a surface (rear surface) of the semiconductor chip 122 opposite the wire 123. The light emitting chip 126 and the light receiving chip 127 are electrically connected to the LSI module 82 and the driver IC chips 124 for photoelectrical conversion through the penetration electrode 128 penetrating the semiconductor chip 122 in the thickness direction and through the wire 123.

Metallic balls 129 used as external-connection material are provided on the rear surface of the semiconductor chip 122. The height of the projection of the metallic ball 129 from the rear surface of the semiconductor chip 122 is greater than the height of the projection of each of the light emitting chip 126 and the light receiving chip 127 from the rear surface of the semiconductor chip 122.

Thus, the semiconductor device 121 that has no penetration waveguide 74 (see FIG. 11) is required to dispose the light emitting chip 126 and the light receiving chip 127 on the side of the rear surface of the semiconductor chip 122 (i.e., on the side of the surface opposite the LSI module 82). Therefore, it was difficult to achieve the size reduction of the semiconductor device.

When the semiconductor device 121 is mounted on the mounting board 86, the position accuracy of the light emitting chip 126 and the light receiving chip 127 with respect to the mounting board 86 depends on the mounting accuracy of the light emitting chip 126 and the light receiving chip 127 with respect to the semiconductor chip 122 (interposer) and depends on the mounting accuracy of the semiconductor chip 122 with respect to the mounting board 86. Therefore, it was impossible to enhance the position accuracy of the light emitting chip 126 and the light receiving chip 127 with respect to the mounting board 86.

In contrast, as shown in FIG. 11, in the semiconductor device 80, not only the light emitting portion 73L and the light receiving portion 73D but also the driver IC for photoelectrical conversion can be formed in the semiconductor substrate 72 itself, not as a chip separated from the semiconductor substrate 72. Since a light signal can be sent and received between the side of the front surface and the side of the rear surface of the semiconductor chip 71A through the penetration waveguide 74 (the through-hole), the light emitting portion 73L and the light receiving portion 73D can be formed on the side of the front surface of the semiconductor chip 71A (the semiconductor substrate 72). Hence, the semiconductor device 80 can be made smaller in size than the semiconductor device 121 (see FIG. 14) in which chips are mounted on both surfaces of the semiconductor chip 122 (interposer) so as to send and receive a light signal for communication with the mounting board 86.

Additionally, in the semiconductor chip 71A provided in the semiconductor device 80 of FIG. 11, since the light emitting portion 73L and the light receiving portion 73D can be directly formed on the semiconductor substrate 72, the position accuracy of the light emitting portion 73L and the light receiving portion 73D with respect to the semiconductor substrate 72 can be enhanced. In other words, when this semiconductor device 80 is mounted on the mounting board 86, the position accuracy of the light emitting portion 73L and the light receiving portion 73D with respect to the mounting board 86 is high, because the position accuracy thereof substantially depends only on the mounting accuracy of the semiconductor device 80 (the semiconductor chip 71A) with respect to the mounting board 86. Therefore, a light signal can be excellently sent and received between the light emitting portion 73L and the mounting board 76 and between the light receiving portion 73D and the mounting board 76.

Figure 12A:
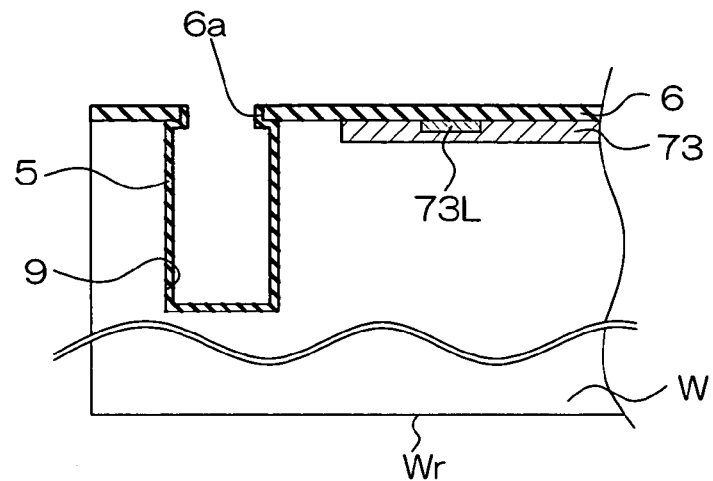
FIG. 12A to FIG. 12C are diagrammatic sectional views for explaining the manufacturing method of the semiconductor chip shown in FIG. 10.
Figure 12B:
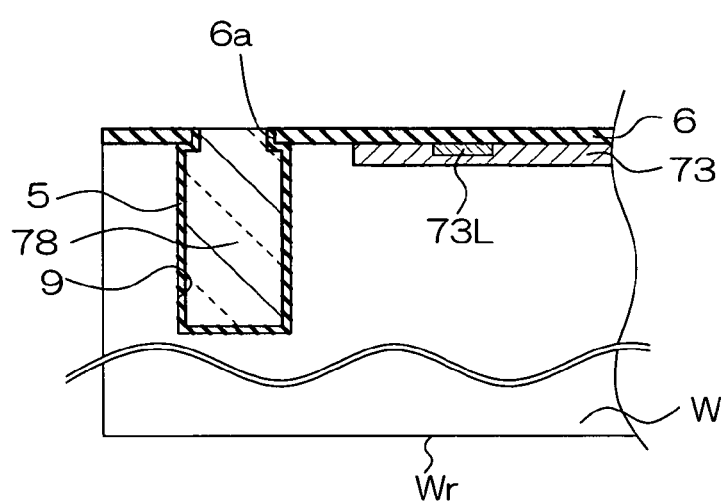
Figure 12C:
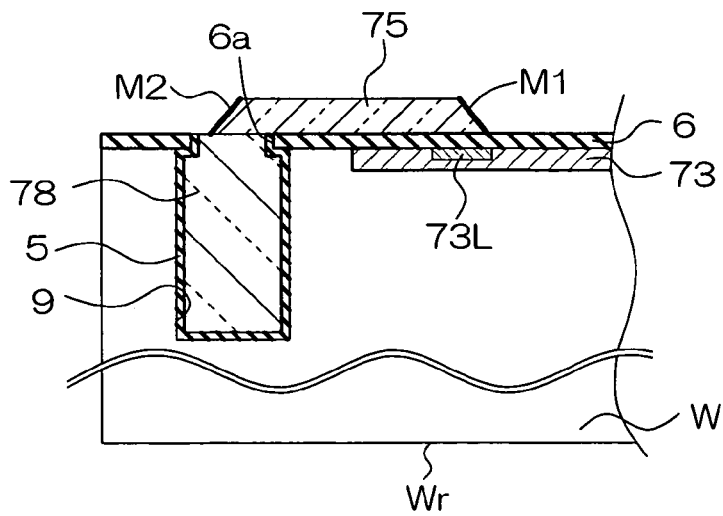
Figure 13A:
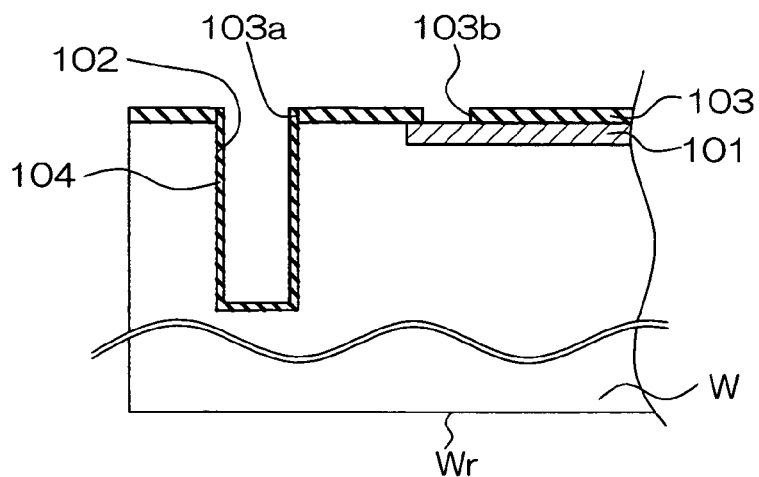
FIG. 13A to FIG. 13H are diagrammatic sectional views for explaining a conventional method for manufacturing a semiconductor chip having a penetration electrode.
Figure 13B:
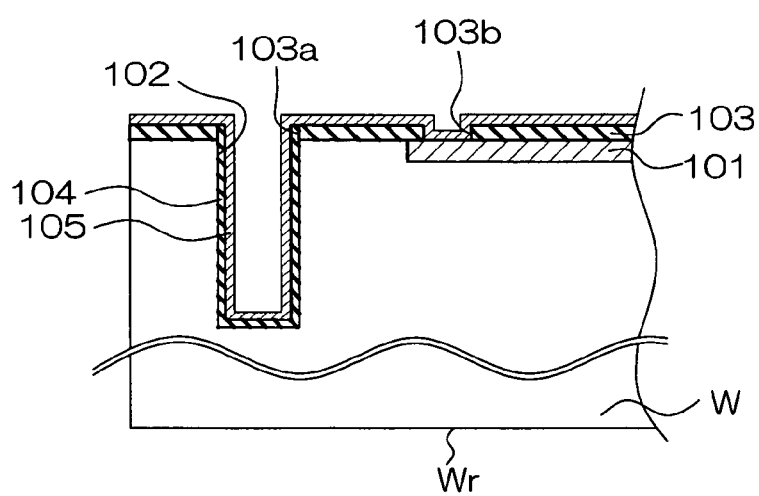
Figure 13C:
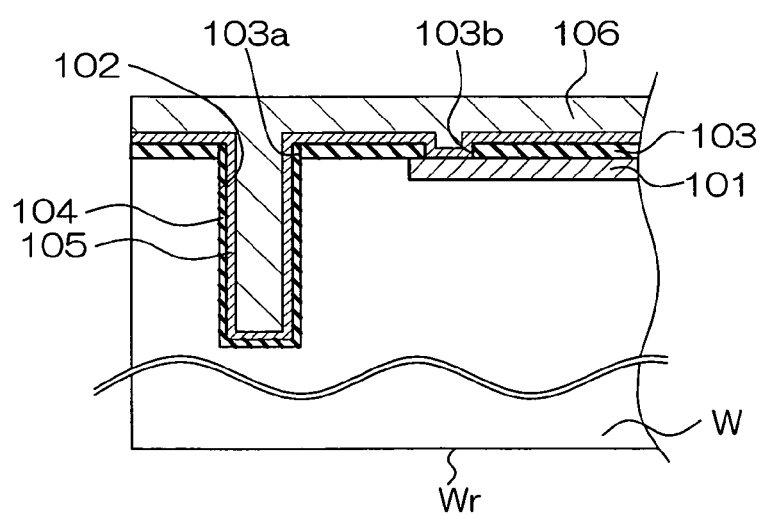
Figure 13D:
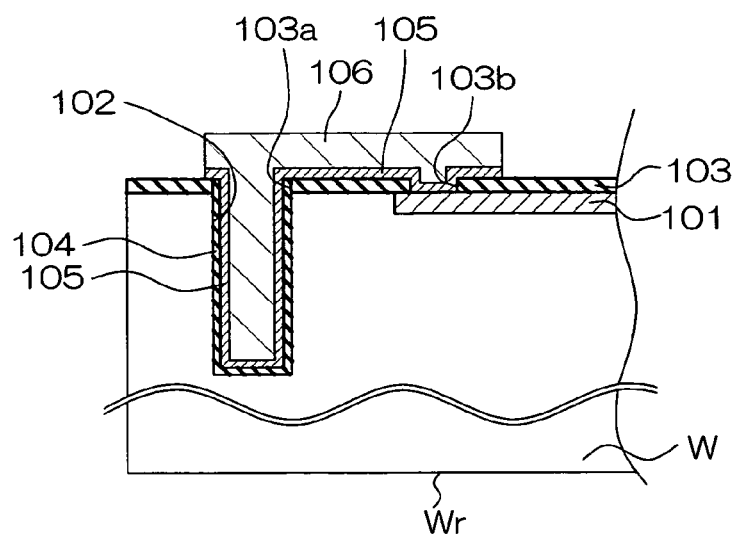
Figure 13E:
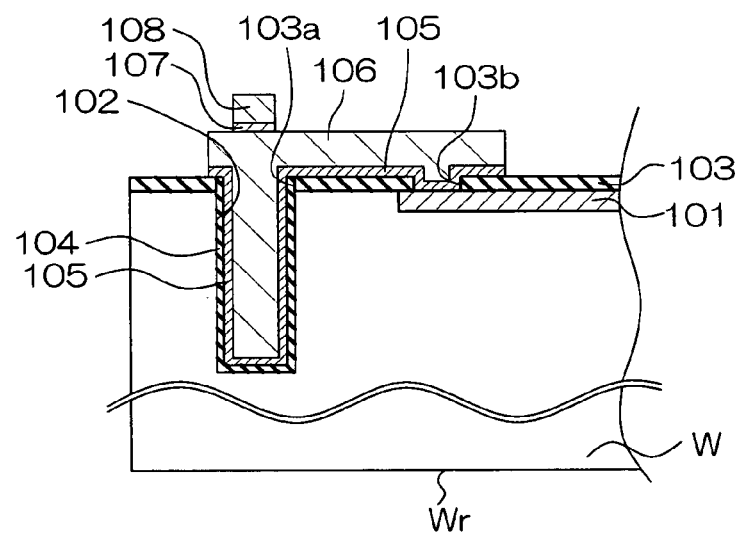
Figure 13F:
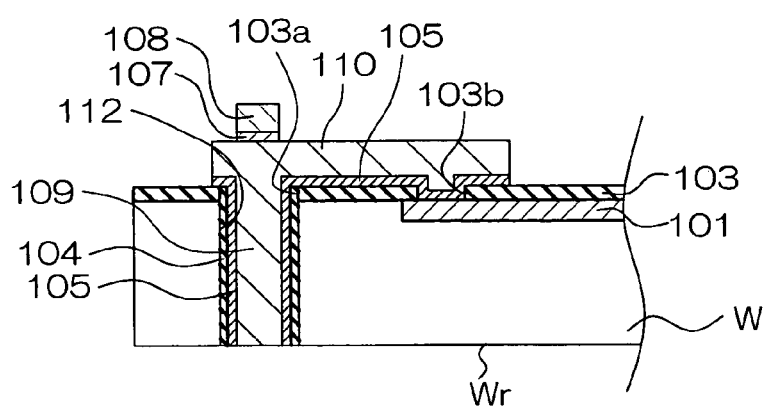
Figure 13G:
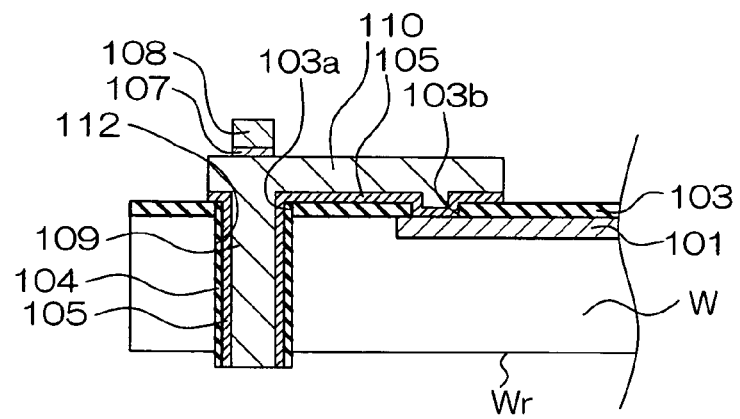
Figure 13H:
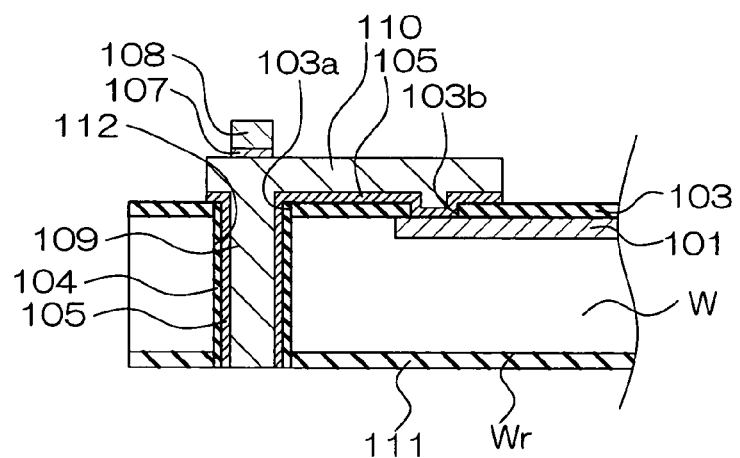

FIG. 12A to FIG. 12C are diagrammatic sectional views for explaining the manufacturing method of the semiconductor chip 71 of FIG. 10. In FIGS. 12A to 12C, the same reference symbol as in FIGS. 2A to 2I is given to an element corresponding to each element of FIGS. 2A to 2I, and a description thereof is omitted.

Although a plurality of semiconductor chips 71 are produced from a single wafer W, only a part of a piece corresponding to one semiconductor chip 71 in the wafer W is shown in FIGS. 12A to 12C. The wafer W of FIGS. 12A to 12C has a plurality of regions, each of which corresponds to the finished semiconductor chip 71 shown in FIG. 10, formed tightly in the in-plane direction of the wafer W.

A hard mask 6 that is made of silicon oxide and that has an opening 6a in its predetermined part is formed on one surface (hereinafter, referred to as "front surface") of a wafer W on which the functional device 73 is formed. The opening 6a is formed such that a region beside the functional device 73 is exposed in the wafer W.

Thereafter, a front-surface-side concave portion 9 is formed in a region beside the functional device 73 by reactive ion etching through the opening 6a of the hard mask 6 in the same way as the manufacturing method of the semiconductor chip 1. The front-surface-side concave portion 9 has a predetermined depth smaller than the thickness of the wafer W. Thereafter, an insulating film 5 made of silicon oxide is formed on an exposed surface inside the opening 6a and the front-surface-side concave portion 9 according to a CVD method. FIG. 12A shows this state.

Thereafter, the inside of the front-surface-side concave portion 9 and the inside of the opening 6a are filled with transparent material (e.g., transparent resin, such as transparent polyimide, or glass) so as to form a plug 78 (see FIG. 12B). The surface of the plug 78 exposed from the opening 6a is made substantially flush with the surface of the hard mask 6.

Thereafter, a surface waveguide 75 separately formed is stuck onto the hard mask 6 and onto the plug 78. At this time, the mirror M1 is positioned above the light emitting portion 73L, and the mirror M2 is positioned above the front-surface-side concave portion 9 (see FIG. 12C).

Thereafter, the front surface of the wafer W is stuck onto a supporter (not shown), and the rear surface Wr of the wafer W (i.e., the surface opposite the functional device 73) is mechanically ground, whereby the wafer W is thinned. As a result, the plug 78 is exposed at the rear surface Wr of the wafer W, and the front-surface-side concave portion 9 is formed into the through-hole 4 penetrating the wafer W in the thickness direction.

Thereafter, the wafer W is cut at predetermined positions so as to produce semiconductor chips 71, one of which is shown in FIG. 10.

In the manufacturing method described above, the inside of the front-surface-side concave portion 9 and the inside of the opening 6a may be filled with an opaque nonmetallic filler, instead of the transparent material, so as to form a dummy plug. If so, the dummy plug can be exposed at the rear surface Wr of the wafer W by grinding, thereafter the dummy plug can be removed. In this case, it is possible to obtain a semiconductor chip in which the inside of the through-hole 4 is not filled with a filler. Even in this case, a light signal can be sent and received through the through-hole 4.

Additionally, when the rear surface Wr of the wafer W is ground, grinding waste never comes into the through-hole 4, because the inside of the front-surface-side concave portion 9 (the through-hole 4) is filled with the filler.

The present invention is embodied according to the foregoing embodiment, but can be embodied according to other embodiments. For example, aluminum (Al), tungsten (W), chrome, titanium, gold (Au), indium (In), or tin (Sn)-based solder, instead copper, may be used as metallic material to be supplied to the inside of the opening 6a and to the inside of the through-hole 4. That is, the penetration electrode 10 and the connection pattern 32 may be made of aluminum, tungsten, chrome, titanium, gold, indium, or tin-based solder.

The step (see FIG. 2I) of filling the inside of the opening 6a and the inside of the through-hole 4 with metallic material may be carried out according to the CVD method, the sputtering method, or the molten-material dipping method. In these cases, the step of forming a seed layer can be omitted.

Without being limited to the BGA package form, the semiconductor device having the semiconductor chips 1, 31, 41, 51, and 61 stacked together can have another package form such as SOP (Small Outline Package), QFP (Quad Flat Package), or QFN (Quad Flat Non-leaded Package).

The embodiments of the present invention have been described in detail as above. However, these are merely concrete examples used to clarify the technical contents of the present invention. Therefore, the present invention should not be understood in the condition of being limited to these examples. The spirit and scope of the present invention are limited only by the scope of the appended claims.

This application is based on Japanese Patent Application No. 2004-241207, filed in the Japan Patent Office on Aug. 20, 2004, the entire contents of which are hereby incorporated by reference.

What is claimed is:

1. A semiconductor device comprising a first semiconductor chip and a second semiconductor chip,
the first semiconductor chip including:
a semiconductor substrate having a front surface and a rear surface;
a functional device formed on the front surface of the semiconductor substrate;

a penetration electrode, being electrically connected to the functional device, disposed in a through-hole penetrating the semiconductor substrate in a thickness direction beside the functional device, the penetration electrode establishing an electrical connection between the front surface and the rear surface of the semiconductor substrate; and a bump being formed integrally with the penetration electrode and jutting from the front surface of the semiconductor substrate, the second semiconductor chip including a wiring member, being formed on one surface of the second semiconductor chip facing the front surface of the semiconductor substrate, and bonded with the bump of the first semiconductor chip, wherein the bump is made of a same material as the penetration electrode.

2. A semiconductor device according to claim 1, wherein the penetration electrode is made of metal, and wherein a continuous diffusion preventing film is formed on a surface of the penetration electrode and on the bump, the diffusion preventing film being made of material by which metal atoms constituting the penetration electrode can be prevented from being diffused to the semiconductor substrate.

* * * * *